(12) United States Patent
Kudou et al.

(10) Patent No.: US 11,652,100 B2
(45) Date of Patent: May 16, 2023

(54) SEMICONDUCTOR DEVICE AND METHOD OF MANUFACTURING THE SAME

(71) Applicant: RENESAS ELECTRONICS CORPORATION, Tokyo (JP)

(72) Inventors: Hiroyoshi Kudou, Tokyo (JP); Taro Moriya, Tokyo (JP); Satoshi Uchiya, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 78 days.

(21) Appl. No.: 17/314,457

(22) Filed: May 7, 2021

(65) Prior Publication Data
US 2021/0398969 A1    Dec. 23, 2021

(30) Foreign Application Priority Data
Jun. 18, 2020  (JP) .............................. JP2020-104950

(51) Int. Cl.
*H01L 27/06* (2006.01)
*H01L 21/265* (2006.01)
(Continued)

(52) U.S. Cl.
CPC ........ *H01L 27/0629* (2013.01); *H01L 21/265* (2013.01); *H01L 27/0255* (2013.01); *H01L 29/0657* (2013.01); *H01L 29/0692* (2013.01); *H01L 29/16* (2013.01); *H01L 29/66128* (2013.01); *H01L 29/66136* (2013.01); *H01L 29/66734* (2013.01); *H01L 29/861* (2013.01); *H01L 29/8611* (2013.01); *H01L 29/66621* (2013.01); *H01L 29/7813* (2013.01)

(58) Field of Classification Search
CPC ............. H01L 27/0629; H01L 27/0255; H01L 29/0657; H01L 29/0692; H01L 29/66128; H01L 29/66136; H01L 29/861; H01L 29/8611; H01L 29/66734; H01L 29/66621; H01L 29/7813
See application file for complete search history.

(56) References Cited

U.S. PATENT DOCUMENTS

| 8,299,599 B2 | 10/2012 | Nakamura et al. |
| 2014/0001539 A1 | 1/2014 | Yagi et al. |

(Continued)

FOREIGN PATENT DOCUMENTS

| JP | 2011-155289 A | 8/2011 |
| JP | 2011-187650 A | 9/2011 |

OTHER PUBLICATIONS

Extended European Search Report issued in corresponding European Patent Application No. 21179427.6-1212, dated Nov. 2, 2021.

*Primary Examiner* — Joseph C. Nicely
(74) *Attorney, Agent, or Firm* — McDermott Will & Emery LLP

(57) ABSTRACT

A semiconductor device has a silicon film for a diode formed on a semiconductor substrate via an insulating film, and first and second wirings formed on an upper layer of the silicon film. The silicon film has a p-type silicon region and a plurality of n-type silicon regions, and each of the plurality of n-type silicon regions is surrounded by the p-type silicon region in a plan view. The p-type silicon region is electrically connected to the first wiring, and the plurality of n-type silicon regions are electrically connected to the second wiring.

19 Claims, 27 Drawing Sheets

(51) Int. Cl.
    *H01L 27/02*     (2006.01)
    *H01L 29/66*     (2006.01)
    *H01L 29/16*     (2006.01)
    *H01L 29/861*     (2006.01)
    *H01L 29/06*     (2006.01)
    *H01L 29/78*     (2006.01)

(56) References Cited

U.S. PATENT DOCUMENTS

| | | | |
|---|---|---|---|
| 2016/0241018 A1* | 8/2016 | Nakano | H01L 27/0629 |
| 2017/0179226 A1 | 6/2017 | Yang | |
| 2019/0067029 A1* | 2/2019 | Kuneshita | H01L 29/083 |
| 2019/0123044 A1* | 4/2019 | Nakano | H01L 29/16 |

* cited by examiner

SEMICONDUCTOR DEVICE AND METHOD OF MANUFACTURING THE SAME

CROSS-REFERENCE TO RELATED APPLICATIONS

The present application claims priority from Japanese Patent Application No. 2020-104950 filed on Jun. 18, 2020, the content of which is hereby incorporated by reference to this application.

BACKGROUND

The present invention relates to a semiconductor device and a method of manufacturing the same and is suitably applicable to, for example, a semiconductor device having a diode and a method of manufacturing the same.

In a semiconductor device having a field effect transistor such as a power MOSFET (Metal-Oxide-Semiconductor Field Effect Transistor) through which a large current flows, a technique of providing a temperature detection function to protect the field effect transistor from overheating has been known. This temperature detection function can be fulfilled, for example, by providing a diode near the field effect transistor and detecting a voltage generated in the diode. At this time, it is utilized that forward current-voltage characteristics of the diode change depending on the temperature.

Japanese Patent Application Laid-open No. 2011-187650 (Patent Document 1) discloses a technique relating to a semiconductor device including a power MOSFET and a diode for temperature detection.

SUMMARY

It is desired to improve reliability in semiconductor devices having diodes.

Other objects and novel characteristics of the present invention will be apparent from the description of the present specification and the accompanying drawings.

According to one embodiment, a semiconductor device includes: a semiconductor substrate; a silicon film for a diode, the silicon film being formed on the semiconductor substrate via a first insulating film; and a first electrode for a diode and a second electrode, the first and second electrodes being formed on an upper layer of the silicon film. The silicon film has a first silicon region of a first conductive type and a plurality of second silicon regions of a second conductive type, the second conductive type being opposite to the first conductive type. Each of the plurality of second silicon regions is surrounded by the first silicon region in a plan view. The first silicon region is electrically connected to the first electrode, and the plurality of second silicon regions are electrically connected to the second electrode.

According to one embodiment, a semiconductor device has a semiconductor substrate and a silicon film for a diode, the silicon film being formed on the semiconductor substrate via a first insulating film. The silicon film has a first silicon region of a first conductive type and a second silicon region of a second conductive type, the second conductive type being opposite to the first conductive type. The second silicon region is surrounded by the first silicon region in a plan view. The second silicon region is exposed on an upper surface of the silicon film, and the first silicon region exists below the second silicon region.

According to the one embodiment, the reliability of the semiconductor device can be improved.

DETAILED DESCRIPTION

Figure 1:
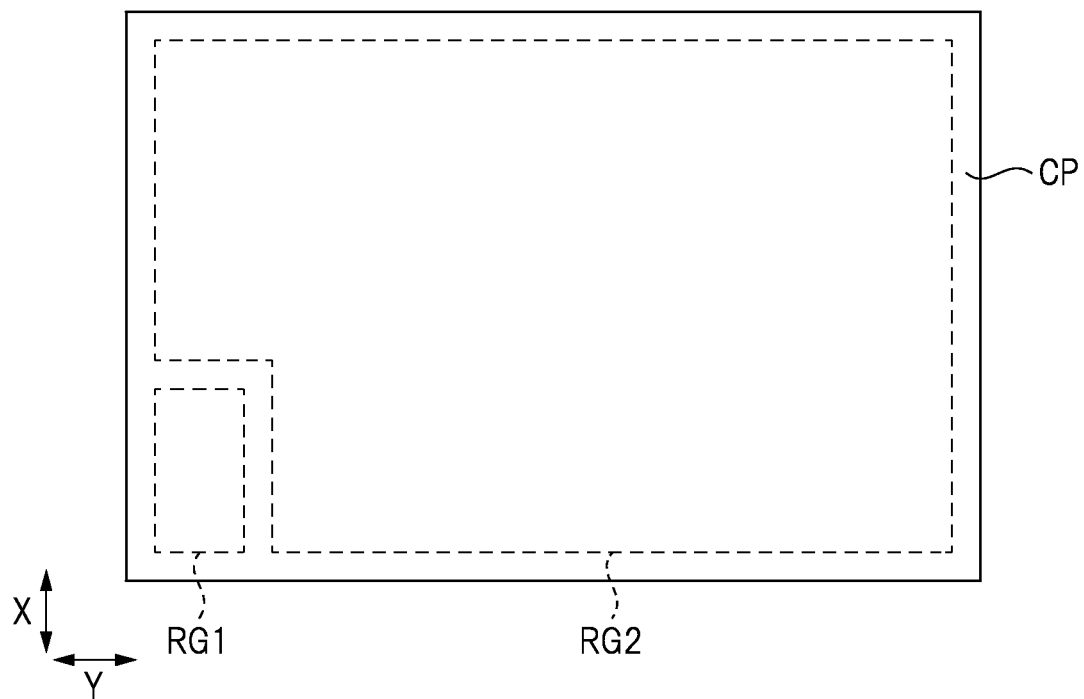
FIG. 1 is a plan view of a semiconductor device according to one embodiment.

In the embodiments described below, the invention will be described in a plurality of sections or embodiments when required as a matter of convenience. However, these sections or embodiments are not irrelevant to each other unless otherwise stated, and the one relates to the entire or apart of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

In the present application, a field effect transistor is described as a MOSFET (Metal Oxide Semiconductor Field Effect Transistor) or simply MOS, but does not exclude a non-oxide film as a gate insulating film. The above-mentioned MOSFET is not limited to a case where the gate insulating film is formed from an oxide film, and is assumed to include a MISFET (Metal Insulator Semiconductor Field Effect Transistor) in which the gate insulating film is widely formed from an insulating film. That is, although the term MOSFET is used in the present specification for convenience, this MOSFET is used in the present specification as a term intended to include a MISFET as well. Therefore, in the following description, the MOSFET can be replaced with the MISFET.

First Embodiment

<Structure of Semiconductor Device>

Figure 2:
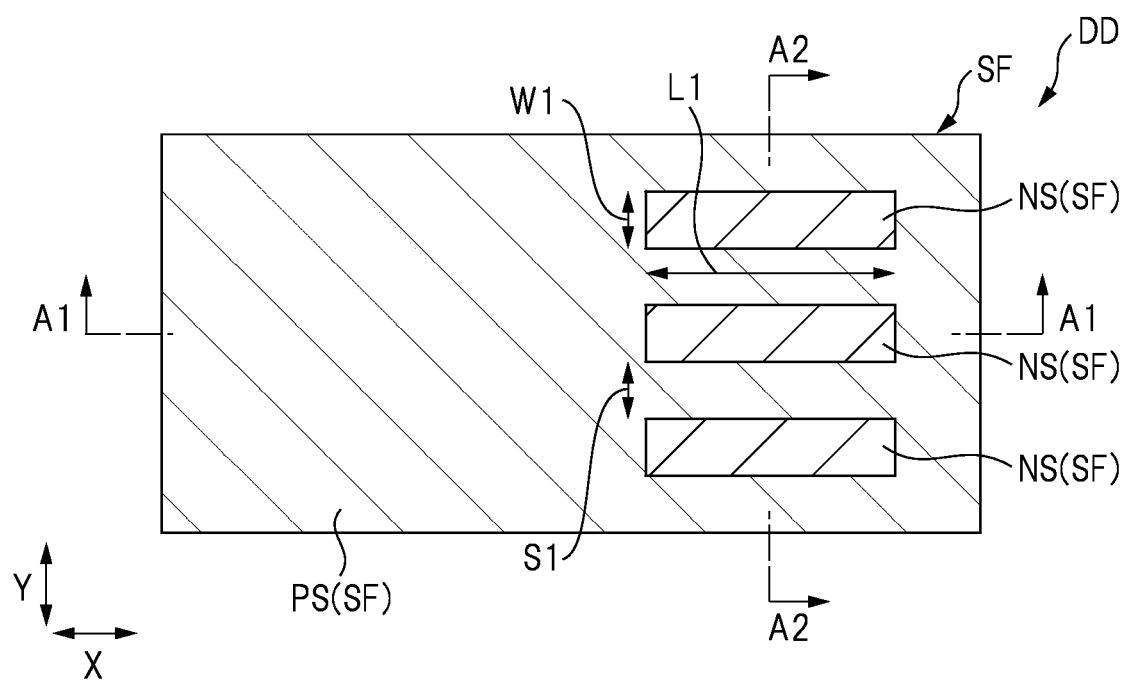
FIG. 2 is a plan view of a main part of the semiconductor device according to the one embodiment.
Figure 3:
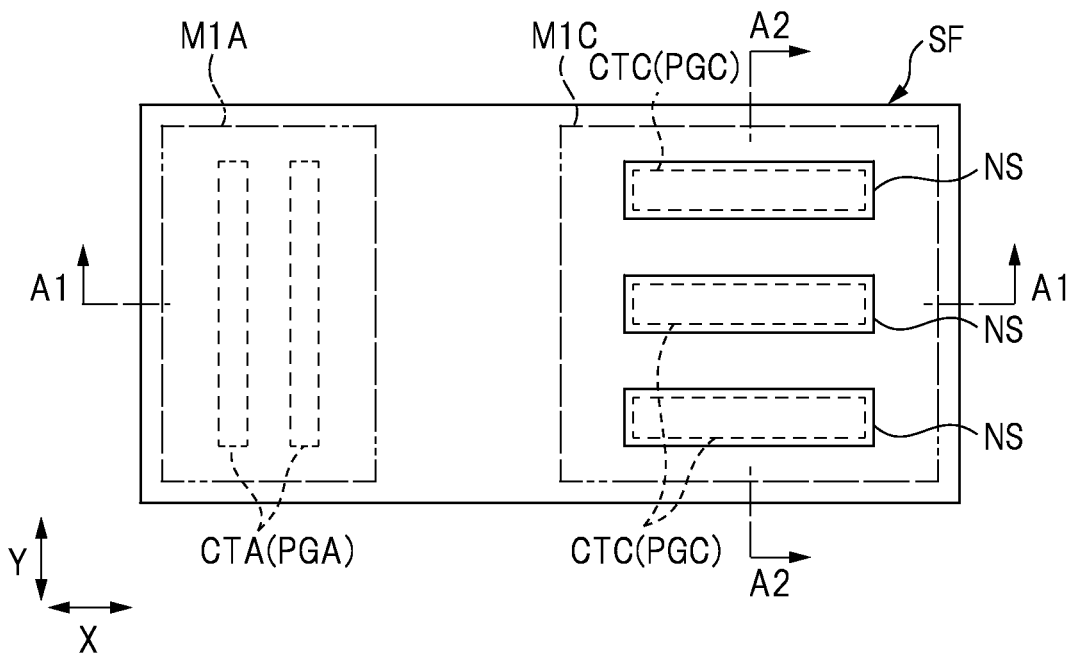
FIG. 3 is a plan view of a main part of the semiconductor device according to the one embodiment.

A semiconductor device according to one embodiment of the present invention will be described with reference to the drawings. FIG. 1 is a plan view of a semiconductor device (semiconductor chip) CP according to the present embodiment, and FIG. 1 shows an overall plan view on an upper surface side of the semiconductor device CP. Each of FIGS. 2 and 3 is a plan view of a main part of the semiconductor device CP according to the present embodiment, and shows a plan view of a diode forming region RG1. Note that FIGS. 2 and 3 show the same plane region. FIG. 2 shows a silicon film SF, in which an n-type silicon region NS and a p-type silicon region PS are respectively hatched. FIG. 3 is a view in which: contact holes CTA and CTC and wirings M1A and M1C are further added to FIG. 2; the contact holes CTA and CTC are shown by dotted lines; and the wirings M1A and M1C are shown by two-dot chain lines. No hatching is used in FIG. 3. X and Y directions shown in FIGS. 1 to 3 and the like are directions substantially parallel to a main surface of a semiconductor substrate SUB constituting the semiconductor device CP, and the X and Y directions are directions intersecting with each other (more specifically, directions orthogonal to each other). Each of FIGS. 4 to 6 is a cross-sectional view of a main part of the semiconductor device CP according to the present embodiment.

Figure 4:
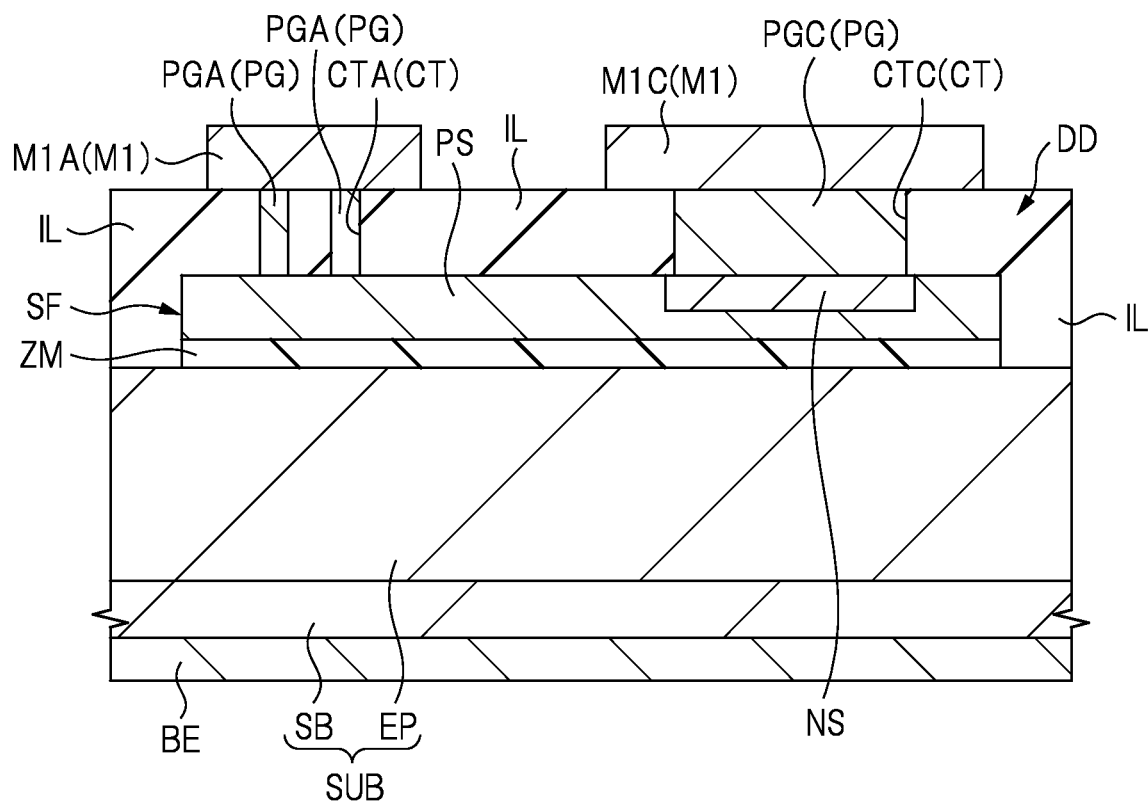
FIG. 4 is a cross-sectional view of a main part of the semiconductor device according to the one embodiment.
Figure 5:
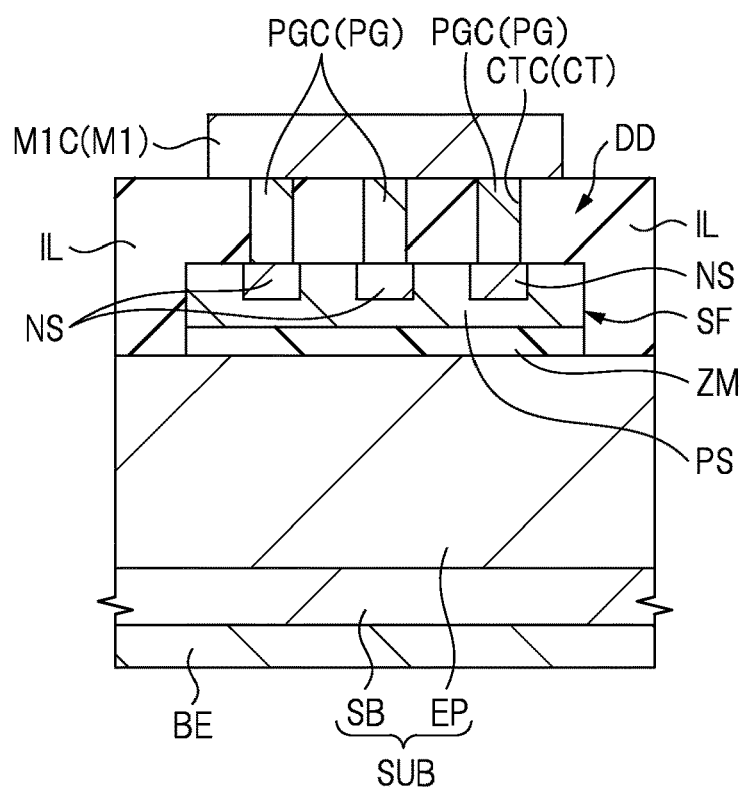
FIG. 5 is a cross-sectional view of a main part of the semiconductor device according to the one embodiment.
Figure 6:
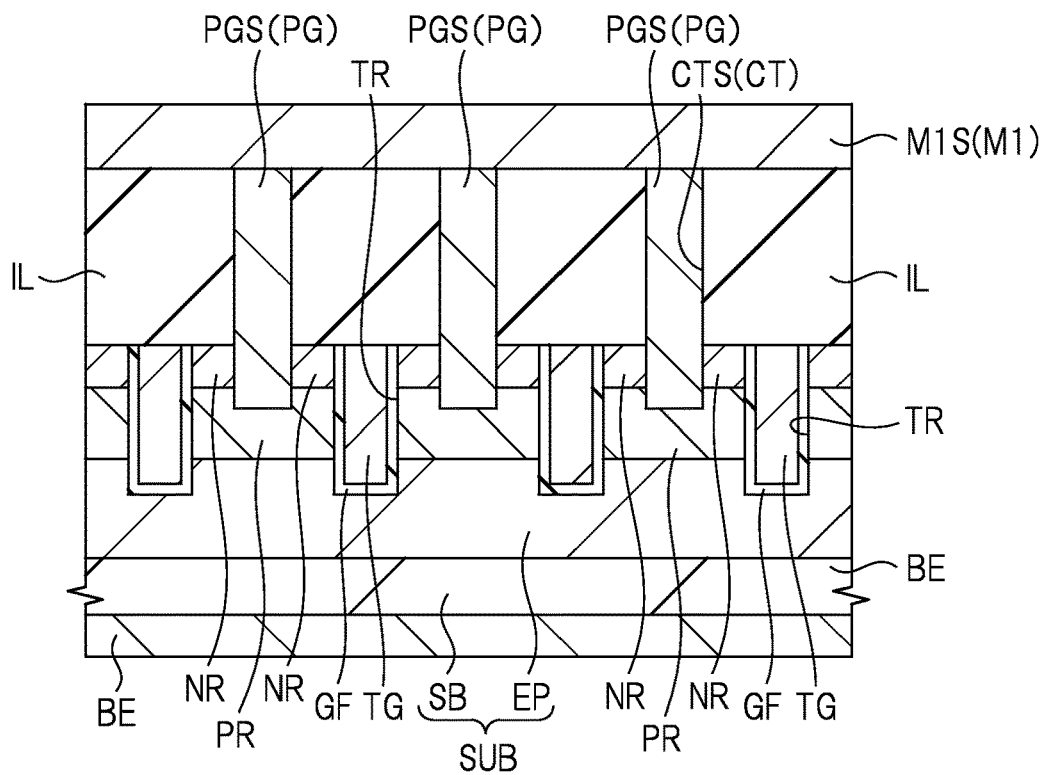
FIG. 6 is a cross-sectional view of a main part of the semiconductor device according to the one embodiment.

The semiconductor device CP of the present embodiment shown in FIGS. 1 to 6 is a semiconductor device including a diode and a power MOSFET. In the semiconductor device CP, a region where a diode DD is formed (planar region) is referred to as a diode forming region RG1, and a region where a power MOSFET is formed (planar region) is referred to as a MOSFET forming region RG2. In the semiconductor device CP, the MOSFET forming region RG2 occupies a considerable large area. FIGS. 4 and 5 are cross-sectional views of the diode forming region RG1. However, each cross-sectional view at positions of lines A1-A1 in FIGS. 2 and 3 substantially corresponds to that in FIG. 4, and each cross-sectional view at positions of lines A2-A2 in FIGS. 2 and 3 is substantially corresponds to that in FIG. 5. FIG. 6 corresponds to a partial cross-sectional view of the MOSFET forming region RG2.

The semiconductor substrate SUB constituting the semiconductor device CP has: a substrate body (semiconductor substrate, semiconductor wafer) SB made of $n^+$ type single crystal silicon or the like into which an n-type impurity such as arsenic (As) is introduced; and an epitaxial layer (semiconductor layer) EP made of, for example, an $n^-$ type silicon single crystal and formed on a main surface of the substrate body SB. Consequently, the semiconductor substrate SUB is a so-called epitaxial wafer.

In the MOSFET forming region RG2, a plurality of unit transistor cells constituting the power MOSFET are formed on the semiconductor substrate SUB, and the power MOSFET is formed by connecting in parallel these plurality of unit transistor cells provided in the MOSFET forming region RG2. Each unit transistor cell is formed of, for example, an n-channel power MOSFET having a trench gate structure.

The semiconductor substrate SUB has a function as a drain region of the above unit transistor cell. A back surface electrode BE for drain is formed on the entire back surface of the semiconductor substrate SUB. The back surface electrode BE functions as a drain terminal (drain electrode) of the power MOSFET.

Note that, in the semiconductor substrate SUB, the main surface on a side opposite to a side on which a trench for the trench gate electrode TG is formed is referred to as a back surface of the semiconductor substrate SUB.

A p-type semiconductor region PR is formed in the semiconductor substrate SUB within the MOSFET forming region RG2, and this p-type semiconductor region PR has a function as a channel forming region of the above unit transistor cell (see FIG. 6).

Further, in the semiconductor substrate SUB within the MOSFET forming region RG2, an $n^+$ type semiconductor region NR is formed over the p-type semiconductor region PR, and this $n^+$ type semiconductor region NR has a function as a source region (semiconductor region for source) of the above unit transistor cell (see FIG. 6). Below the $n^+$ type semiconductor region NR, the p-type semiconductor region PR exists. The semiconductor substrate SUB in a portion interposed between the p-type semiconductor region PR and the back surface electrode BE maintains an n-type conductive type and has a function as a drain region of the above unit transistor cell.

As shown in FIG. 6, a trench TR extending in a thickness direction of the semiconductor substrate SUB from the main surface of the semiconductor substrate SUB is formed in the MOSFET forming region RG2, and a trench gate electrode TG is embedded via a gate insulating film GF in the trench TR. Since the gate insulating film GF made of an insulating film such as a silicon oxide film is formed on a bottom surface and a side surface of the trench TR, the gate insulating film GF is interposed between the trench gate electrode TG embedded in the trench TR and the semiconductor substrate SUB. The trench gate electrode TG is made of a conductive film embedded in the trench TR of the semiconductor substrate SUB and is made of, for example, a doped polysilicon film. Although not shown, the trenches TR are formed on the main surface of the semiconductor substrate SUB in, for example, a stripe or lattice shape in a plan view. The trench TR is formed so as to penetrate the $n^+$ type semiconductor region NR and the p-type semiconductor region PR from the upper surface of the semiconductor substrate SUB and to terminate in the n-type semiconductor substrate SUB (epitaxial layer EP). Consequently, a bottom surface of the trench TR is deeper than a bottom surface of the $n^+$ type semiconductor region NR and deeper than a bottom surface of the p-type semiconductor region PR, and is located in a middle of the n-type semiconductor substrate SUB (epitaxial layer EP) in a depth direction thereof. Note that a case where a plan view is referred to about components of the semiconductor device CP corresponds to a case of being viewed from a plane substantially parallel to the main surface of the semiconductor substrate SUB constituting the semiconductor device CP. Further, a case where a planar shape is referred to about the components of the semiconductor device CP corresponds to a shape (planar shape) in a plan view.

Each trench TR shown in FIG. 6 and each trench gate electrode TG embedded therein extend in a direction perpendicular to a sheet of FIG. 6, but the trench gate electrodes TG are integrally coupled in an area that is not shown in the cross-sectional view of FIG. 6.

Further, as shown in FIGS. 2 to 5, a silicon film (semiconductor film) SF for a diode DD is formed over the semiconductor substrate SUB via an insulating film ZM within the diode forming region RG1. That is, the insulating film ZM is formed on the semiconductor substrate SUB, and the silicon film SF constituting the diode DD is formed on the insulating film ZM. The silicon film SF is, more specifically, a polycrystalline silicon film (polysilicon film), and is patterned into a predetermined planar shape (for example, a rectangular shape).

The silicon film SF has a p-type silicon region (p-type semiconductor region) PS and a plurality of n-type silicon regions (n-type semiconductor regions) NS, and each of the plurality of n-type silicon regions NS is surrounded by a p-type silicon region PS in a plan view. From another viewpoint, the silicon film SF is formed by the p-type silicon region PS and the plurality of n-type silicon regions NS surrounded by the p-type silicon regions PS. Each of the plurality of n-type silicon regions NS is adjacent to the p-type silicon region PS.

In the silicon film SF, since a portion other than a portion to be the n-type silicon region NS is the p-type silicon region PS, this also makes it possible to regard the silicon film SF as a p-type silicon film and consider the plurality of n-type silicon regions NS to be formed in the p-type silicon film.

In the silicon film SF, the plurality of n-type silicon regions NS are formed so as to be separated from each other. Consequently, the p-type silicon region PS is interposed between the adjacent n-type silicon regions NS, and each n-type silicon region NS is surrounded by the p-type silicon region PS in a plan view. Each n-type silicon region NS contacts with the p-type silicon region PS, and a PN junction is formed (in an interface) between each n-type silicon region NS and the p-type silicon region PS.

Each of the plurality of n-type silicon regions NS formed on the silicon film SF is exposed on the upper surface of the silicon film SF. A depth position of each bottom surface of the plurality of n-type silicon regions NS formed on the silicon film SF is shallower than that of a lower surface of the silicon film SF. Therefore, a thickness of each n-type silicon region NS is smaller than that of the silicon film SF, and the p-type silicon region PS exists below the bottom surface of each n-type silicon region NS. Consequently, a side surface and the bottom surface of each n-type silicon region NS contact with the p-type silicon region PS, and the PN junctions are formed on the side surface and the bottom surface of each n-type silicon region NS.

The plurality of n-type silicon regions NS formed on the silicon film SF each extend in the X direction, are separated from each other in the Y direction intersecting with (more specifically, orthogonal to) the X direction in a plan view, and lines up. Each of the plurality of n-type silicon regions NS formed on the silicon film SF has, in a plan view, a rectangularly planar shape whose longitudinal direction is the X direction. A length L1 of the planar shape of each n-type silicon region NS in the X direction can be, for example, about 2 to 40 μm. Further, a width W1 of the planar shape of each n-type silicon region NS in the Y direction can be, for example, about 0.2 to 1.0 μm. Further, a distance S1 between the n-type silicon regions NS in the Y direction can be, for example, about 0.8 to 2.0 μm. Note that the length L1, width W1, and interval S1 are shown in FIG. 2.

A diode DD is formed by forming the PN junction (in an interface) between the p-type silicon region PS and each of the plurality of n-type silicon regions NS. That is, the p-type silicon region PS of the silicon film SF serves as an anode (anode region) of the diode DD, and each of the plurality of n-type silicon regions NS of the silicon film SF serves as a cathode (cathode region) of the diode DD. The diode DD is a diode for temperature detection.

As shown in FIGS. 4 to 6, an insulating film IL is formed on the entire main surface of the semiconductor substrate SUB so as to cover the trench gate electrode TG, the insulating film ZM, and the silicon film SF. The insulating film IL is an interlayer insulating film and is made of, for example, a silicon oxide film. The insulating film IL is formed in the MOSFET forming region RG2 and the diode forming region RG1.

Contact holes (openings, through holes) CT are formed in the insulating film IL. The contact holes CT include a contact hole CTS for the source, a contact hole (not shown) for the gate, a contact hole CTA for the anode, and a contact hole CTC for the cathode.

The contact hole CTS for the source is formed on the $n^+$ type semiconductor region NR, penetrates the $n^+$ type semiconductor region NR, and reaches the p-type semiconductor region PR. Consequently, the $n^+$ type semiconductor region NR and the p-type semiconductor region PR are exposed at a bottom of the contact hole CTS for the source. The contact hole CTA for the anode is formed on the p-type silicon region PS of the silicon film SF, and the p-type silicon region PS of the silicon film SF is exposed at a bottom of the contact hole CTA for the anode. The contact hole CTC for the cathode is formed on each of the plurality of n-type silicon regions NS of the silicon film SF, and each of the n-type silicon regions NS is exposed at the bottom of the contact hole CTC. A gate drawer portion (not shown) integrally formed with the trench gate electrode TG is extended on the semiconductor substrate SUB outside the trench TR, and the contact hole (not shown) for the gate is formed on the gate drawer portion.

A conductive plug (contact plug, embedded conductor portion for connection) PG is formed in the contact hole CT of the insulating film IL. The plug PG is made of, for example, a tungsten (W) film or the like. The plug PG penetrates the insulating film IL. The plug PG includes: a source plug (contact plug) PGS formed in the contact hole CTS; a gate plug (not shown) formed in the contact hole for gate; an anode plug (contact plug) PGA formed in the contact hole CTA; and a cathode plug (contact plug) PGC formed in the contact hole CTC. The source plug PGS is electrically connected to the $n^+$ type semiconductor region NR and the p-type semiconductor region PR. The anode plug PGA embedded in the contact hole CTA contacts with the p-type silicon region PS exposed at the bottom of the contact hole CTA, and is electrically connected to the p-type silicon region PS. The cathode plug PGC embedded in the contact hole CTC contacts with the n-type silicon region NS exposed at the bottom of the contact hole CTC, and is electrically connected to the n-type silicon region NS.

Wirings (electrodes) M1 are formed on the insulating film IL in which the plug PG is embedded. The wiring M1 includes a source wiring (electrode) M1S, a gate wiring (not shown), an anode wiring (electrode) M1A, and a cathode wiring (electrode) M1C. An upper surface of the source plug PGS contacts with the source wiring M1S, and is electrically connected to the wiring M1S. An upper surface of the anode plug PGA contacts with the anode wiring M1A, and is electrically connected to the wiring M1A. An upper surface of the cathode plug PGC contacts with the cathode wiring M1C, and is electrically connected to the wiring M1C. The wiring M1 is formed of a patterned conductor film. The wiring M1 is made of, for example, a metal film containing aluminum (Al) as a main component, specifically, is made of an aluminum film or an aluminum alloy film.

The source wiring M1S is formed in almost the entire MOSFET forming region RG2. The source contact holes CTS are formed in the MOSFET forming region RG2, and source regions ($n^+$ type semiconductor regions NR) and channel forming regions (p-type semiconductor regions PR) in a plurality of unit transistor cells provided in the MOS- FET forming region RG2 are electrically connected to a common wiring M1S via the source plugs PGS embedded in the plurality of contact holes CTS. The wiring M1S can also be regarded as a source electrode. Further, a trench gate electrodes TG of the plurality of unit transistor cells is electrically connected to a gate wiring (not shown) via a gate drawer portion (not shown) and a gate plug (not shown) that are integrally formed with the trench gate electrode TG.

The wiring M1A and M1C are formed in an upper layer higher in position than the silicon film SF. The p-type silicon region PS of the silicon film SF is electrically connected to the anode wiring (electrode) M1A via the anode plug PGA. The wiring M1A can also be regarded as an anode electrode. Further, the plurality of n-type silicon regions NS formed on the silicon film SF are electrically connected to the cathode wiring (electrode) M1C via the plurality of cathode plugs PGC. That is, the plug PGC is arranged on each of the plurality of n-type silicon regions NS formed on the silicon film SF, and the wiring M1C is arranged so as to overlap with the plurality of plugs PGC in a plan view, so that the plurality of n-type silicon regions NS formed in the silicon film SF become states of being electrically connected to the common wiring M1C via the plurality of plugs PGC. The wiring M1C can also be regarded as a cathode electrode. The plugs PGA and PGC penetrate the insulating film (interlayer insulating film) IL formed between the silicon film SF and the wirings M1A and M1C. The anode plug PGA overlaps with the p-type silicon region PS of the silicon film SF in a plan view, and overlaps with the anode wiring M1A in a plan view. The plurality of cathode plugs PGC are respectively different from the plurality of n-type silicon regions NS formed on the silicon film SF in a plan view, and overlap with the cathode wiring M1C in a plan view.

In cases of FIGS. 2 and 3, the plug PGC has a rectangularly planar shape, whose longitudinal direction is the X direction, according to the n⁺ semiconductor region NR having the rectangularly planar shape whose longitudinal direction is the X direction. The plug PGC contacts with the n-type silicon region NS, but does not contact with the p-type silicon region PS. Further, in the case of FIG. 3, the plug PGA has a rectangularly planar shape whose longitudinal direction is the Y direction in a plan view, and the plurality of (here, two) plugs PGA are arranged so as to be separated in the X direction. The number of plugs PGA may arbitrarily be one or more. The plug PGA contacts with the p-type silicon region PS, but does not contact with the n-type silicon region NS.

The illustration and description of a structure above the wiring M1 will be omitted here. For example, a bonding pad can also be formed by forming an insulating film (protective film, passivation film) on the insulating film IL so as to cover the wiring M1 and partially exposing the wiring M1 from the opening of the insulating film. Alternatively, the present embodiment may have a structure of forming an insulating film (interlayer insulating film) on the insulating film IL so as to cover the wiring M1 and forming a second layer wiring on the insulating film.

In the semiconductor device having such a configuration, an operating current of the power MOSFET flows between the wiring M1S for the source and the back electrode BE for the drain. That is, the operating current of the trench gate type MISFET formed in the MOSFET forming region RG2 flows in a thickness direction of the semiconductor substrate SUB.

Further, in the present embodiment, the case where the trench gate type MISFET is applied as the field effect transistor formed on the semiconductor substrate SUB has been described, but the present invention is not limited to this, and another type of field effect transistor can also be formed in the MOSFET forming region RG2 of the semiconductor substrate SUB.

For example, a trench gate type IGBT may also be formed in the MOSFET forming region RG2 of the semiconductor substrate SUB instead of the trench gate type MISFET.

Further, an LDMOSFET (Laterally Diffused Metal-Oxide-Semiconductor Field Effect Transistor) or the like may also be formed in the MOSFET forming region RG2 of the semiconductor substrate SUB instead of the trench gate type MISFET.

The diode DD formed in the diode forming region RG1 is a diode for detecting temperature of the power MOSFET formed in the MOSFET forming region RG2, and can be regarded as a diode for detecting heat generation of the power MOSFET formed in the MOSFET forming region RG2.

Since voltage-current characteristics of the diode change depending on the temperature, the temperature of the diode DD in the semiconductor device CP can be detected by detecting (monitoring) the voltage-current characteristics of the diode DD formed in the diode forming region RG1.

Consequently, in the semiconductor device CP, by arranging the diode DD (diode forming region RG1) in the vicinity of the power MOSFET (MOSFET forming region RG2), the temperature (heat generation) of the power MOSFET can be detected by the diode DD.

For example, in the semiconductor device CP, when the power MOSFET formed in the MOSFET forming region RG2 generates excessive heat and the temperature of the diode DD becomes higher than a predetermined upper limit temperature, the above control circuit supplies an OFF signal (or stops a supply of an ON signal) to a gate of the power MOSFET in the semiconductor device CP, thereby switching the power MOSFET to an OFF state. Consequently, in the semiconductor device CP, when the power MOSFET generates excessive heat, the power MOSFET can be quickly switched to the OFF state since the excess heat is detected by the diode DD.

<Background of Examination>

Figure 7:
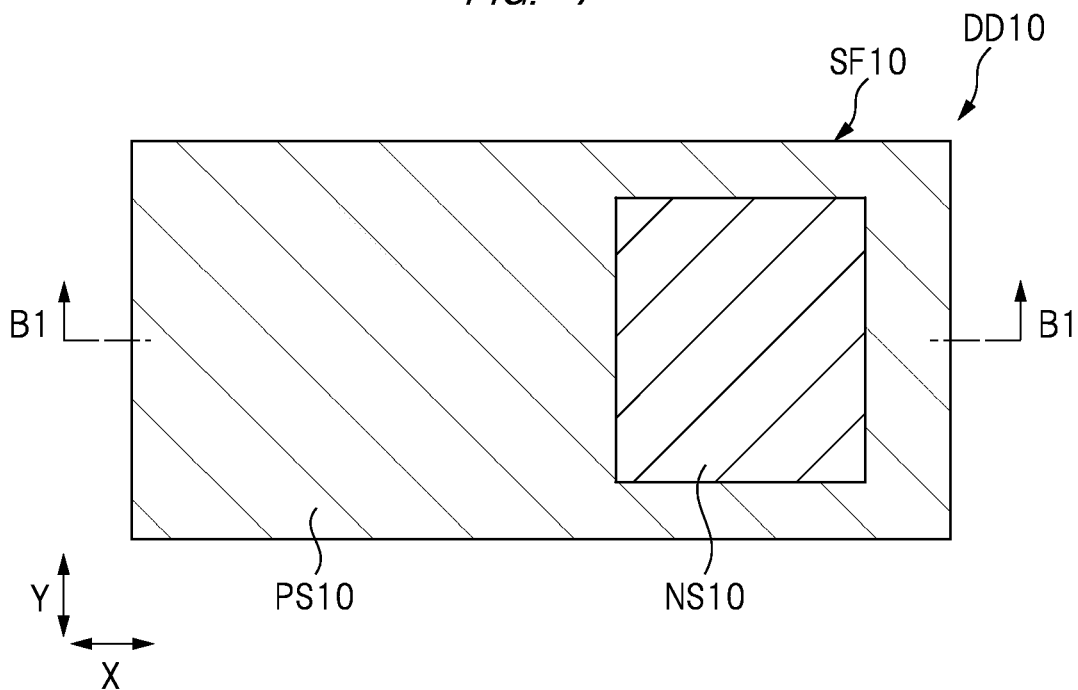
FIG. 7 is a plan view of a main part of a semiconductor device in the form of an examination example.
Figure 8:
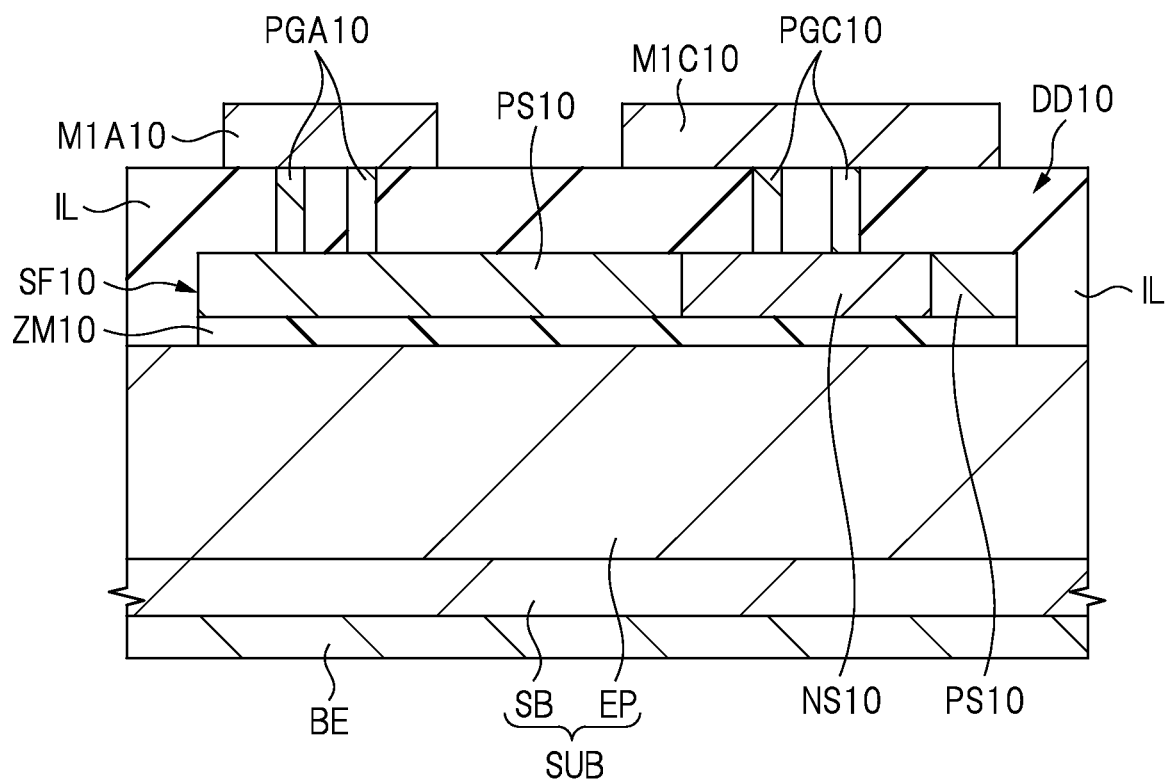
FIG. 8 is a cross-sectional view of a main part of a semiconductor device in the form of a review example.

FIG. 7 is a plan view of a main part of a semiconductor device of an examination example that has been examined by the present inventors, and FIG. 8 is a cross-sectional view of a main part of a semiconductor device of an examination example that has been examined by the present inventors. FIGS. 7 and 8 show diode forming regions in the semiconductor devices of the examination examples, and a cross-sectional view at a position of line B1-B1 in FIG. 7 corresponds to that of FIG. 8.

In the semiconductor device of the examination example, as shown in FIGS. 7 and 8, a silicon film SF10 made of polycrystalline silicon is formed over a semiconductor substrate SUB10 via an insulating film ZM10. The silicon film SF10 is composed of one p-type silicon region PS10 and one n-type silicon region NS10, and the n-type silicon region NS10 is surrounded by the p-type silicon region PS10 in a plan view.

The n-type silicon region NS10 is formed so as to penetrate the silicon film SF10 in a thickness direction of the silicon film SF10. That is, the thickness of the n-type silicon region NS10 is substantially the same as the thickness of the silicon film SF10. Consequently, the n-type silicon region NS10 is exposed on an upper surface of the silicon film SF10, and is exposed on a lower surface of the silicon film SF10. Therefore, the p-type silicon region PS10 does not exist under the n-type silicon region NS10.

For this reason, a side surface of the n-type silicon region NS10 contacts with the p-type silicon region PS10, and PN junction is formed on the side surface of the n-type silicon region NS10. No PN junction is formed on a bottom surface of the n-type silicon region NS10. The p-type silicon region PS10 functions as an anode (anode region) of the diode DD10, and the n-type silicon region NS10 functions as a cathode (cathode region) of the diode DD10. The p-type silicon region PS10 is electrically connected to an anode wiring M1A10 via a plug PGA10, and the n-type silicon region NS10 is electrically connected to a cathode wiring M1C10 via a plug PGC10.

The diode DD10 formed in the semiconductor device of the examination example can be used for, for example, temperature detection of the power MOSFET formed in the semiconductor device of the same examination example. However, when a heat generation amount of the diode DD10 is large, reliability of the diode DD10 may be degraded due to the heat generation of the diode DD10. For example, risk of thermal destruction (destruction due to heat generation) of the diode DD10 may increase. This leads to a decrease in the reliability of the semiconductor device having the diode. Further, when the heat generation amount of the diode DD10 is large, a temperature rise due to the heat generation of the diode DD10 occurs, so that temperature detection accuracy of the diode DD10 may decrease. This leads to a decrease in performance of the semiconductor device including the diode.

The PN junction constituting the diode DD10 includes a PN junction surface between the p-type silicon region PS10 and the n-type silicon region NS10, and the PN junction surface corresponds to the side surface of the n-type silicon region NS10. A current flowing through the diode DD10 flows through this PN junction surface. Operating resistance of the diode DD10 depends on an area of the PN junction surface constituting the diode DD10. When the area of the PN junction surface is small, the operating resistance of the diode DD10 becomes large and when the area of the PN junction surface is large, the operating resistance of the diode DD10 becomes small. Note that the operating resistance of the diode corresponds to a resistance value at a time when a current value to be a reference (current reference value) flows.

The heat generation amount (Joule heat) of the diode DD10 becomes smaller as the operating resistance is smaller under the condition that the flowing current is the same, so that the heat generation amount becomes smaller as the area of the PN junction surface is larger. Consequently, if the heat generation amount of the diode DD10 is reduced in order to improve the reliability of the diode DD10, the increase in the area of the PN junction surface of the diode DD10 is effective. For doing so, dimensions of the silicon film SF10 needs to be increased. However, increasing the dimensions of the silicon film SF10 constituting the diode DD10 causes an increase in plane dimensions (plane area) of the semiconductor device (semiconductor chip) including the diode DD10, which brings making the semiconductor device large (large area). Further, when the dimensions of the silicon film SF10 constituting the diode DD10 are increased and the power MOSFET forming region is reduced, the current flowing through the power MOSFET becomes smaller, which brings deterioration of the performance of the semiconductor device. Meanwhile, if the dimensions of the silicon film SF10 constituting the diode DD10 are reduced, the area of the PN junction surface is reduced and, as a result, the operating resistance of the diode DD10 is increased. This brings the increase in the heat generation amount of the diode DD10 as described above, so that problems as mentioned above depending on such an increase may be caused.

<Main Features and Effects>

The semiconductor device CP of the present embodiment is the semiconductor device including the diode DD. The semiconductor device CP has: the semiconductor substrate SUB; the silicon film SF for the diode DD, which is formed over the semiconductor substrate SUB via the insulating film ZM (first insulating film); and the wiring M1A (first electrode) and wiring M1C (second electrode) that are formed on an upper layer of the silicon film SF. The silicon film SF has a p-type silicon region PS (first silicon region) and a plurality of n-type silicon regions NS (second silicon regions), each of the plurality of n-type silicon regions NS being surrounded by the p-type silicon region PS in a plan view. The p-type silicon region PS of the silicon film SF is electrically connected to the wiring M1A, and the plurality of n-type silicon regions NS of the silicon film SF are electrically connected to the wiring M1C.

As having been explained in the column of the above-mentioned background of examination, when the diode is formed by a silicon film having a p-type silicon region and an n-type silicon region, an area of the PN junction is desired to be increased while the plane dimensions of the silicon film are suppressed.

Thus, in the present embodiment, the plurality of n-type silicon regions NS (second silicon regions) are provided in the silicon film SF for the diode DD, and each of the plurality of n-type silicon regions NS are surrounded by the p-type silicon PS in a plan view. Consequently, the area of the PN junction formed in the silicon film SF for the diode DD can be increased while the plane dimensions of the silicon film SF are suppressed.

That is, in the present embodiment, the plurality of n-type silicon regions NS are provided in the silicon film SF for the diode DD, and each of the plurality of n-type silicon regions NS is surrounded by the p-type silicon region PS in a plan view, so that the PN junction is formed on each side surface of the plurality of n-type silicon regions NS. When the number of n-type silicon regions NS formed in the silicon film SF is increased, the total number of side surfaces of the n-type silicon regions NS, on which the PN junctions are formed, increases, so that the area of the PN junction formed in the silicon film SF can be increased. Consequently, a case of providing the plurality of n-type silicon regions NS in the silicon film SF like the present embodiment can be increased larger in the total number of sides of the n-type silicon regions NS, on which the PN junctions are formed, than a case of providing only one n-type silicon region NS10 in the silicon film SF10 like the above-mentioned examination example. Therefore, the total area of the sides of the n-type silicon regions NS, on which the PN junctions are formed, can be increased. As a result, the total area of the PN junctions constituting the diode DD can be increased.

Further, the p-type silicon region PS of the silicon film SF is electrically connected to the wiring M1A, and the plurality of n-type silicon regions NS of the silicon film SF are electrically connected to the wiring M1C. Consequently, the p-type silicon region PS of the silicon film SF can function as the anode of the diode DD, and each of the plurality of n-type silicon regions NS of the silicon film SF can function as the cathode of the diode DD. When a predetermined voltage is applied between the wiring M1A and the wiring M1C, a current flows through the diode DD and the current can flow via the PN junction surfaces between the p-type silicon region PS of the silicon film SF and the plurality of n-type silicon regions NS of the silicon film SF. Therefore, since any of the plurality of n-type silicon regions NS of the silicon film SF can function as the cathode (cathode region) of the diode DD, the increase in the number of n-type silicon regions NS of the silicon film SF makes it possible to increase the total area of the PN junctions between the cathode region (n-type silicon region NS) and anode region (p-type silicon region PS) for the diode DD.

In the present embodiment, the plurality of n-type silicon regions NS are provided in the silicon film SF for the diode DD, and each of the plurality of n-type silicon regions NS is surrounded by the p-type silicon region PS in a plan view. By doing so, the plurality of n-type silicon regions NS are electrically connected to the wiring M1C. This makes it possible to increase the total area of the PN junctions constituting the diode DD and to reduce the operating resistance of the diode DD. As a result, the heat generation amount of the diode DD can be suppressed. For this reason, the reliability of the diode DD can be improved and, accordingly, the reliability of the semiconductor device CP including the diode DD can be improved. For example, the risk of thermal destruction of the diode DD (destruction due to heat generation) can be suppressed, and durability of the diode DD against the thermal destruction can be improved. Further, since the heat generation amount of the diode DD can be suppressed, the temperature rise due to the heat generation of the diode DD can be suppressed when the diode DD is used for temperature detection, so that the accuracy of the temperature detection of the diode DD can be improved. Therefore, the performance of the semiconductor device including the diode DD can be improved.

Further, in the present embodiment, the total area of the PN junctions constituting the diode DD can be increased by providing the plurality of n-type silicon regions NS in the silicon film SF for the diode DD, so that total area of the PN junctions constituting the diode DD can be efficiently increased without increasing the plane dimensions. Consequently, the total area of the PN junctions constituting the diode DD can be increased while the plane dimensions (plane area) of the silicon film SF is suppressed. Therefore, the plane dimensions of the silicon film SF for the diode DD can be suppressed, and the semiconductor device CP can be miniaturized (made small in area). Further, since the plane dimensions of the silicon film SF constituting the diode DD can be suppressed, the area of the MOSFET forming region RG2 in the semiconductor device CP can be secured. This makes it possible to increase the current flowing through the power MOSFET and, also in this respect, to improve the performance of the semiconductor device CP.

Further, in the present embodiment, each of the plurality of n-type silicon regions NS formed in the silicon film SF is exposed on the upper surface of the silicon film SF. This makes it easy to electrically connect, to the wiring M1C via the plug PGC, each of the plurality of n-type silicon regions NS formed in the silicon film SF. Further, in the silicon film SF, since each of the plurality of n-type silicon regions NS is surrounded by the p-type silicon region PS in a plan view, the p-type silicon region PS is also exposed on the upper surface of the silicon film SF. This makes it easy to electrically connect the p-type silicon region PS of the silicon film SF to the wiring MIA via the plug PGA.

In addition, in the present embodiment, the p-type silicon region PS exists under each of the plurality of n-type silicon regions NS in the silicon film SF. Consequently, the PN junctions are formed on the side surface and the bottom surface (lower surface) of each of the plurality of n-type silicon regions NS formed in the silicon film SF. Since the PN junctions are formed not only on the side surface but also on the bottom surface of each of the plurality of n-type silicon regions NS formed in the silicon film SF, the total area of the PN junctions between the cathode region (n-type silicon region NS) and the anode region (p-type silicon region PS) of the diode DD can be further increased. This makes it possible to further reduce the operating resistance of the diode DD and, as a result, to further suppress the heat generation amount of the diode DD. This makes it possible to further improve the reliability of the diode DD and, accordingly, to further improve the reliability of the semiconductor device CP including the diode DD. Further, when the diode DD is used for the temperature detection, the accuracy of the temperature detection of the diode DD can be further improved and, accordingly, the performance of the semiconductor device including the diode DD can be further improved. Further, since the area of the PN junction formed in the silicon film SF for the diode DD can be increased more efficiently while the plane dimensions of the silicon film SF are suppressed, the plane dimensions of the silicon film SF for the diode DD can be further increased and the semiconductor device CP can be further miniaturized (made small in area).

Further, in the present embodiment, the number of n-type silicon regions NS formed in the silicon film SF is two or more, and FIGS. 2 and 3 each show a case where the number of n-type silicon regions formed in the silicon film SF is three. The case where the number of n-type silicon regions NS formed in the silicon film SF is three can be made further larger in the total area of the PN junctions constituting the diode DD than the case where the number is two. Further, the number of n-type silicon regions NS formed in the silicon film SF can be four or more.

Figure 9:
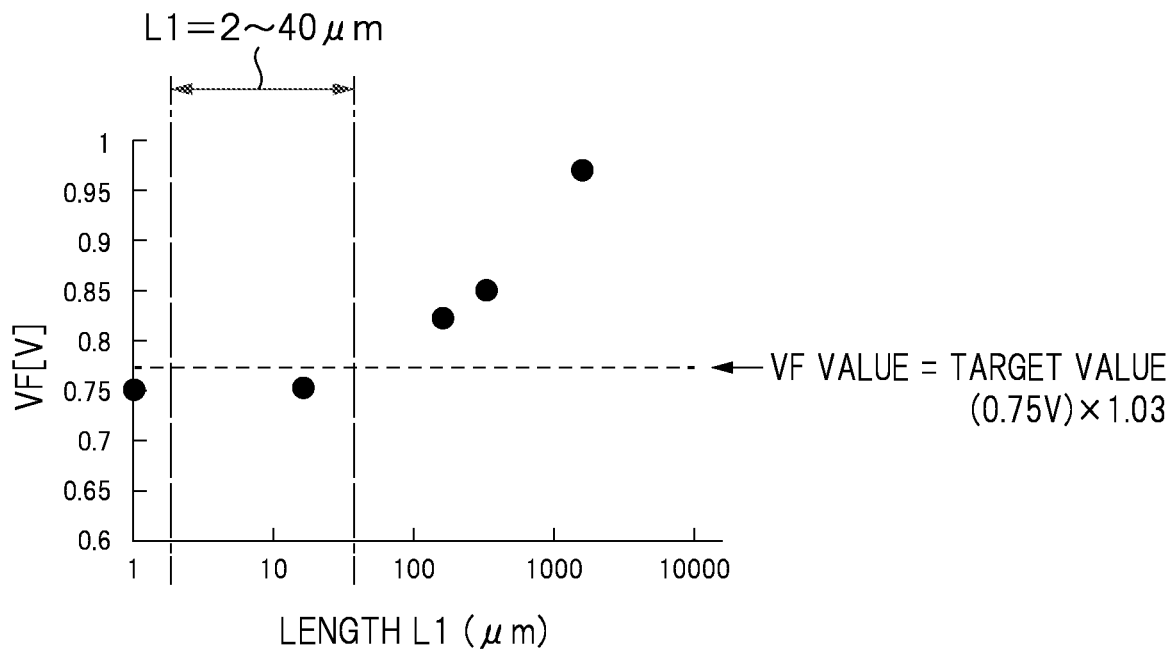
FIG. 9 is a graph showing characteristics of a diode.
Figure 10:
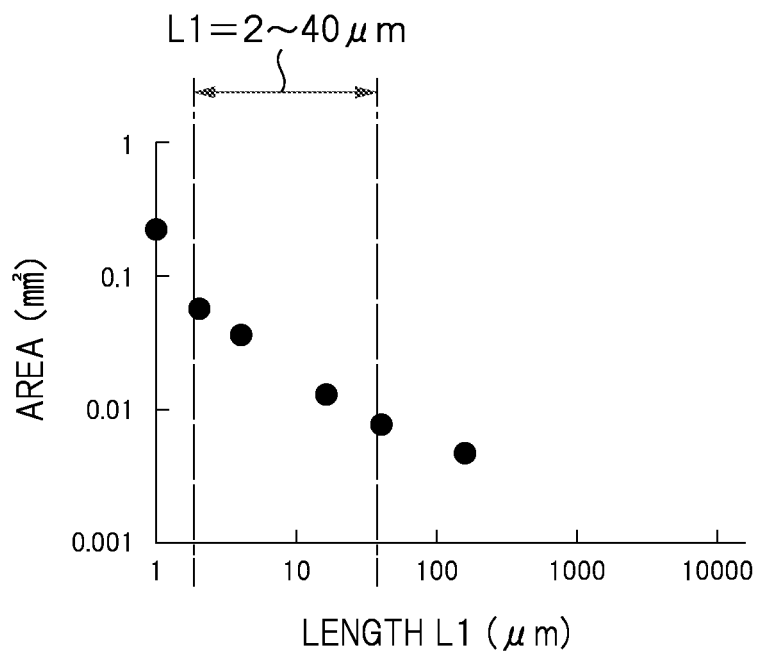
FIG. 10 is a graph showing characteristics of the diode.
Figure 11:
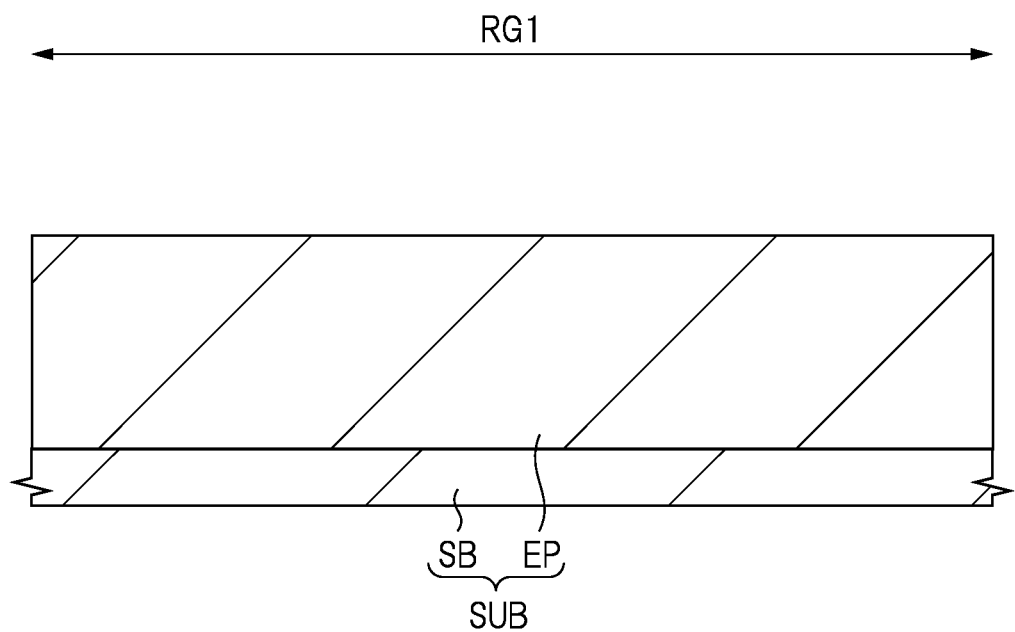
FIG. 11 is a cross-sectional view of a main part of a semiconductor device according to one embodiment during a manufacturing process.

FIGS. 9 and 10 are graphs each showing characteristics of a diode to which the present embodiment is applied. A horizontal axis of the graph in FIG. 9 and a horizontal axis of the graph in FIG. 10 correspond to a length L1 of each of the plurality of n-type silicon regions NS formed in the silicon film SF in an X direction. A vertical axis of the graph in FIG. 9 corresponds to a voltage value VF (hereinafter, referred to as VF value) at a time when a current reference value flows through the diode. As the current reference value, for example, an arbitrary current value of about 50 to 100 pA can be used. Further, a vertical axis of the graph in FIG. 10 corresponds to an area of the silicon film SF. Note that each graph of FIGS. 9 and 10 corresponds to a case where the length L1 of the n-type silicon region NS is changed while the total area of the PN junction is kept constant.

As can be seen from the graph of FIG. 9, when the length L1 of the n-type silicon region NS in the X direction is 40 µm or less, the VF value is almost constant. However, when the length L1 is larger than 40 µm, the VF value exceeds the upper limit value (1.03 times of a target value). As the length L1 increases, the VF value also increases. This is because: when the length L1 of the n-type silicon region NS in the X direction is 40 µm or less, almost the entire side surface of the n-type silicon region NS can function as a passage path of a current; and when the length L1 of the n-type silicon region NS in the X direction exceeds 40 µm, a portion that does not function as the passage path of the current occurs in the side surface of the n-type silicon region NS. Therefore, in order to enable the entire side surface of the n-type silicon region NS to function as the passage path of the current and to efficiently secure an effective area of the PN junction that functions as a current path, the length L1 of the n-type silicon region NS in the X direction is preferably 40 μm or less.

As can be seen from FIG. 10, when the total area of the PN junctions is constant, increasing the length L1 makes it possible to reduce the area of the silicon film SF, while decreasing the length L1 brings an increase in the area of the silicon film SF. Consequently, in order to secure the area of the PN junction while the plane dimensions (plane area) of the silicon film SF is suppressed, it is desirable that the length L1 of the n-type silicon region NS in the X direction is not too small. From this viewpoint, the length L1 of the n-type silicon region NS in the X direction is preferably 2 μm or more.

Therefore, the length L1 of the n-type silicon region NS in the X direction is preferably 2 μm or more and 40 μm or less. This makes it possible to efficiently increase the effective area of the PN junction that functions as the current path while the plane dimensions (plane area) of the silicon film SF is suppressed.

<Manufacturing Process of Semiconductor Device>

Next, an example of a manufacturing process of the semiconductor device of the present embodiment will be described with reference to FIGS. 11 to 32. FIGS. 11 to 32 are each a cross-sectional view of a main part of the semiconductor device of the present embodiment during the manufacturing process. Note that FIGS. 11, 13, 15, 17, 19, 19, 21, 23, 25, 27, 29, and 31 among FIGS. 11 to 32 show cross sections corresponding to that of FIG. 4 as described above (hence, a cross section of the diode forming region RG1). Further, FIGS. 12, 14, 16, 18, 18, 20, 22, 24, 26, 28, 30 and 32 among FIGS. 11 to 32 show cross sections (hence, a cross section of the MOSFET forming region RG2) corresponding to that of FIG. 6 as described above.

To manufacture a semiconductor device, first, as shown in FIGS. n and 12, a semiconductor substrate SUB (semiconductor wafer) is prepared. The semiconductor substrate SUB has a substrate body SB made of n⁺ type single crystal silicon or the like, and an epitaxial layer EP made of n⁻ type silicon single crystal formed on a main surface of the substrate body SB.

Figure 12:
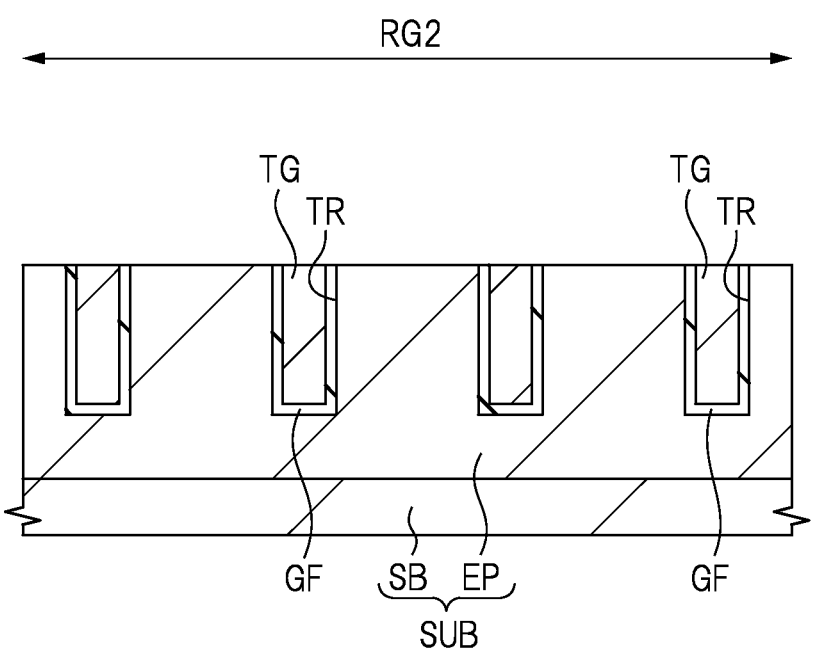
FIG. 12 is a cross-sectional view of a main part of the same semiconductor device as that in FIG. 11 during the manufacturing process.

Next, in the MOSFET forming region RG2, trenches TR are formed in the main surface of the semiconductor substrate SUB (epitaxial layer EP) by using photolithography technology and etching technology (see FIG. 12).

Next, a trench gate electrode TG is formed in the trench TR via the gate insulating film GF (see FIG. 12). For example, an insulating film for the gate insulating film GF is formed on a side surface and a bottom surface of the trench TR and on the upper surface of the semiconductor substrate SUB by a thermal oxidation method or the like. Thereafter, a conductive film (for example, a polysilicon film) for the trench gate electrode TG is formed on the insulating film so as to fill an inside of the trench. Then, the conductive film outside the trench TR is removed by an etch-back method. This makes it possible to form the trench gate electrode TG and the gate insulating film GF.

Figure 13:
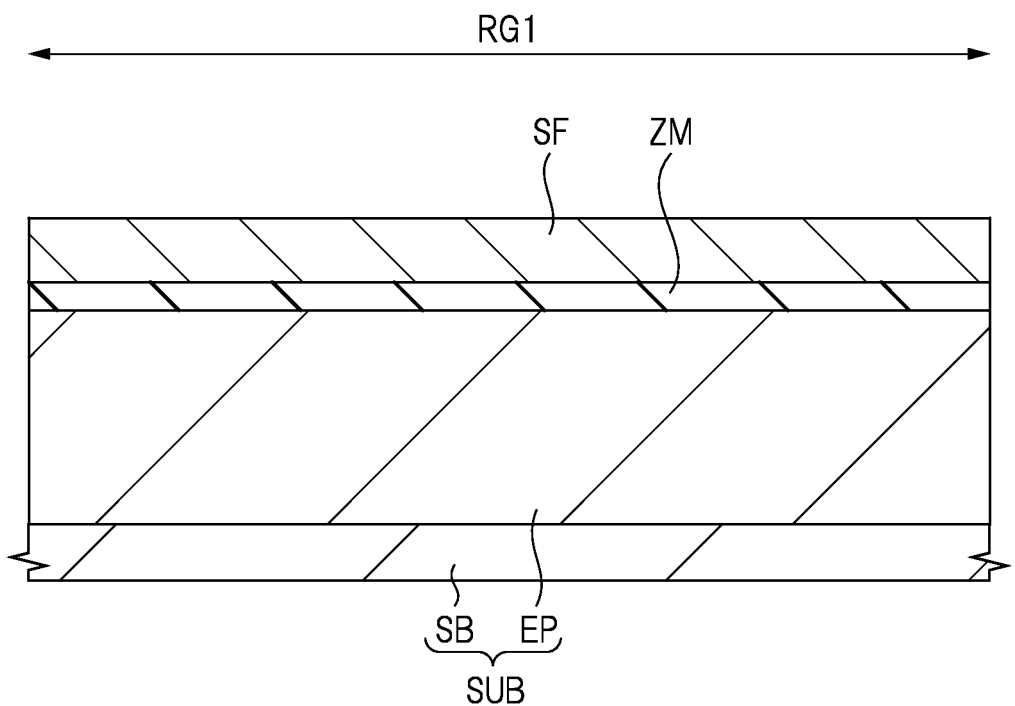
FIG. 13 is a cross-sectional view of a main part of the semiconductor device during a manufacturing process following FIG. 11.
Figure 14:
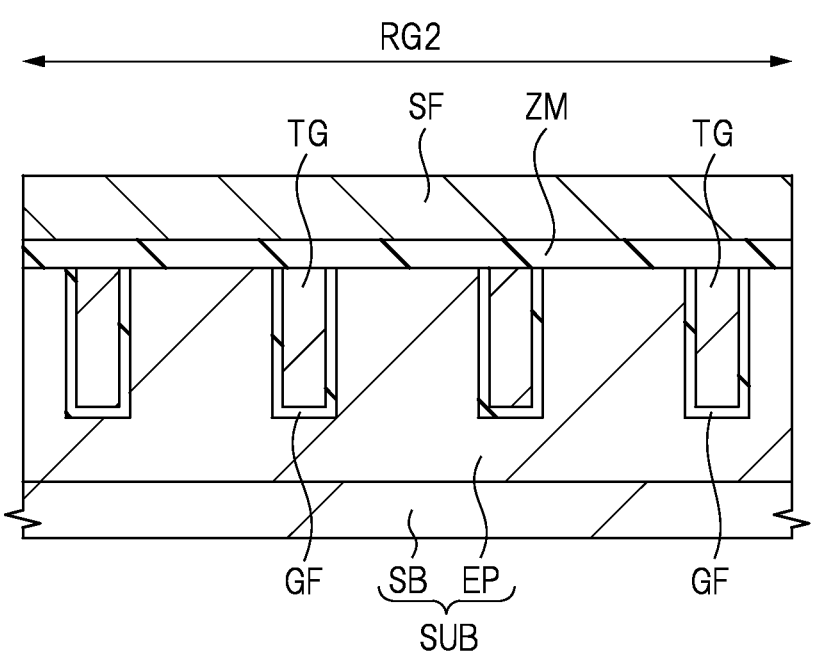
FIG. 14 is a cross-sectional view of a main part of the same semiconductor device as that in FIG. 13 during the manufacturing process.

Next, as shown in FIGS. 13 and 14, an insulating film ZM is formed on the semiconductor substrate SUB. Then, a silicon film SF is formed on the insulating film ZM by using a CVD (Chemical Vapor Deposition) method or the like. Therefore, the silicon film SF is formed over the semiconductor substrate SUB via the insulating film ZM. At this stage, the silicon film SF is made of a non-doped polycrystalline silicon film.

Next, a p-type impurity is introduced into the silicon film SF by using an ion implantation method or the like. At this time, by introducing the p-type impurity (for example, boron) into the entire silicon film SF, the silicon film SF becomes a p-type silicon film (p-type polycrystalline silicon film).

Figure 15:
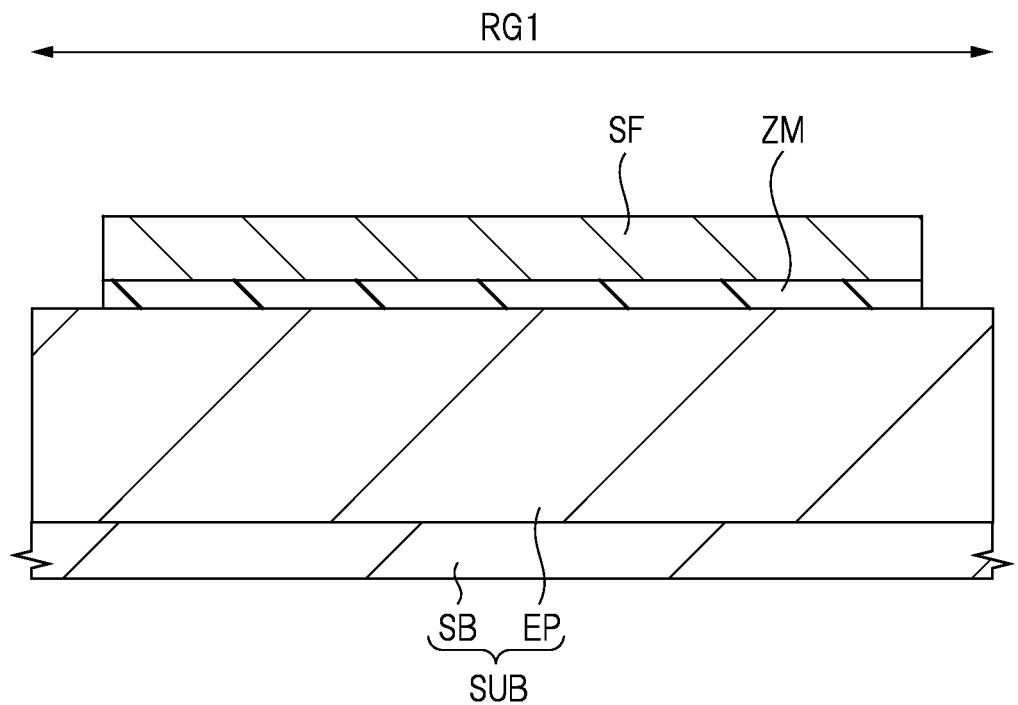
FIG. 15 is a cross-sectional view of a main part of the semiconductor device during the manufacturing process following FIG. 13.
Figure 16:
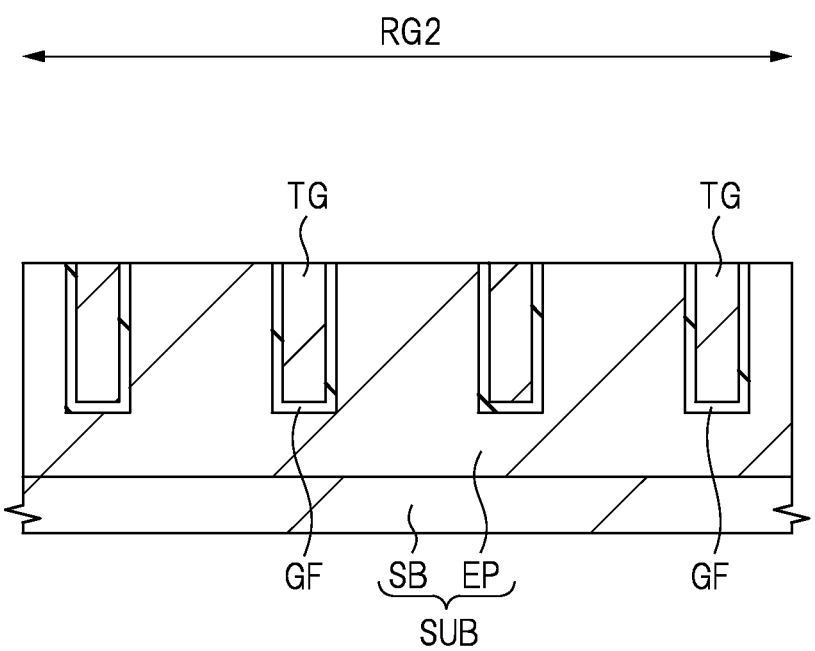
FIG. 16 is a cross-sectional view of a main part of the same semiconductor device as that in FIG. 15 during the manufacturing process.

Next, as shown in FIGS. 15 and 16, a laminated film composed of the insulating film ZM and the silicon film SF on the insulating film ZM is patterned by using a photolithography technique and an etching technique. Consequently, the silicon film SF is patterned into a predetermined planar shape. At this time, in the MOSFET forming region RG2 (FIG. 16), the silicon film SF and the insulating film ZM are removed and in the diode forming region RG1 (FIG. 15), the patterned silicon film SF remains and becomes a silicon film SF for the diode DD.

Figure 17:
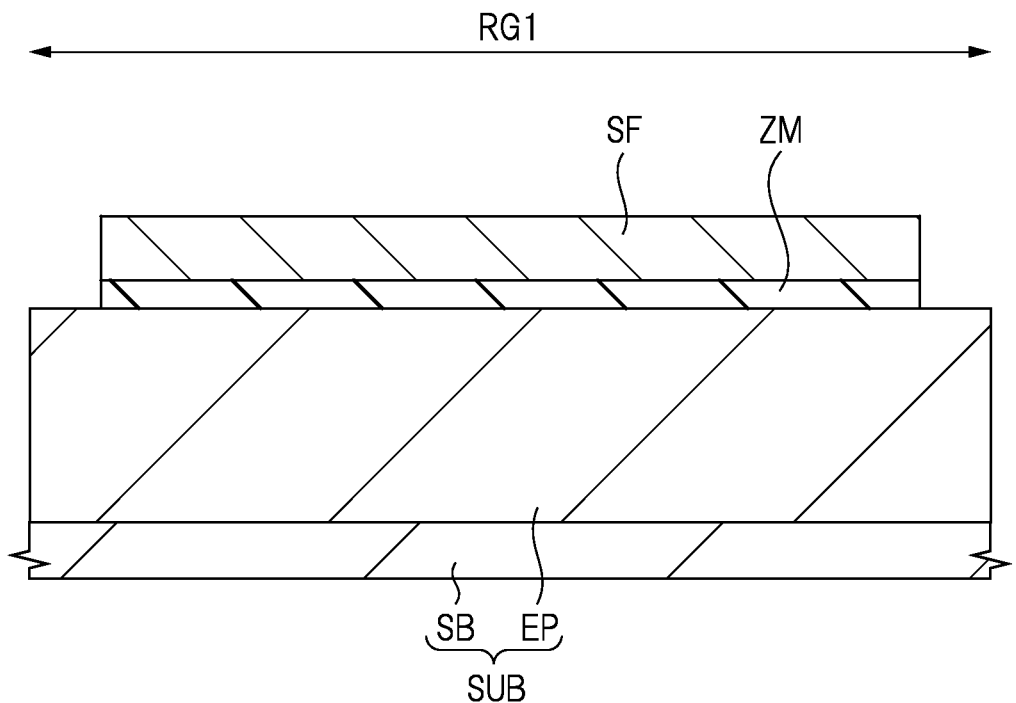
FIG. 17 is a cross-sectional view of a main part of the semiconductor device during the manufacturing process following FIG. 15.
Figure 18:
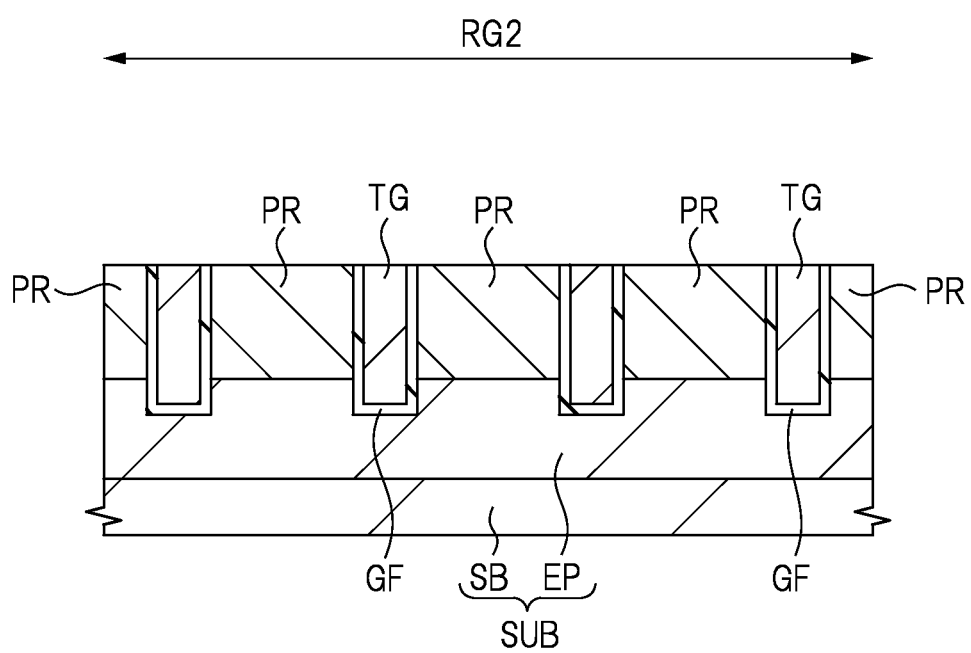
FIG. 18 is a cross-sectional view of a main part of the same semiconductor device as that in FIG. 17 during the manufacturing process.

Next, as shown in FIGS. 17 and 18, in the MOSFET forming region RG2 (FIG. 18), a p-type semiconductor region PR is formed by ion-implanting a p-type impurity into the main surface of the semiconductor substrate SUB. The p-type semiconductor region PR is formed on an upper layer portion of the semiconductor substrate SUB (epitaxial layer EP). At this time, the silicon film SF in the diode forming region RG1 (FIG. 17) is covered with a photoresist layer (not shown) or the like to prevent the ion implantation from being introduced.

Figure 19:
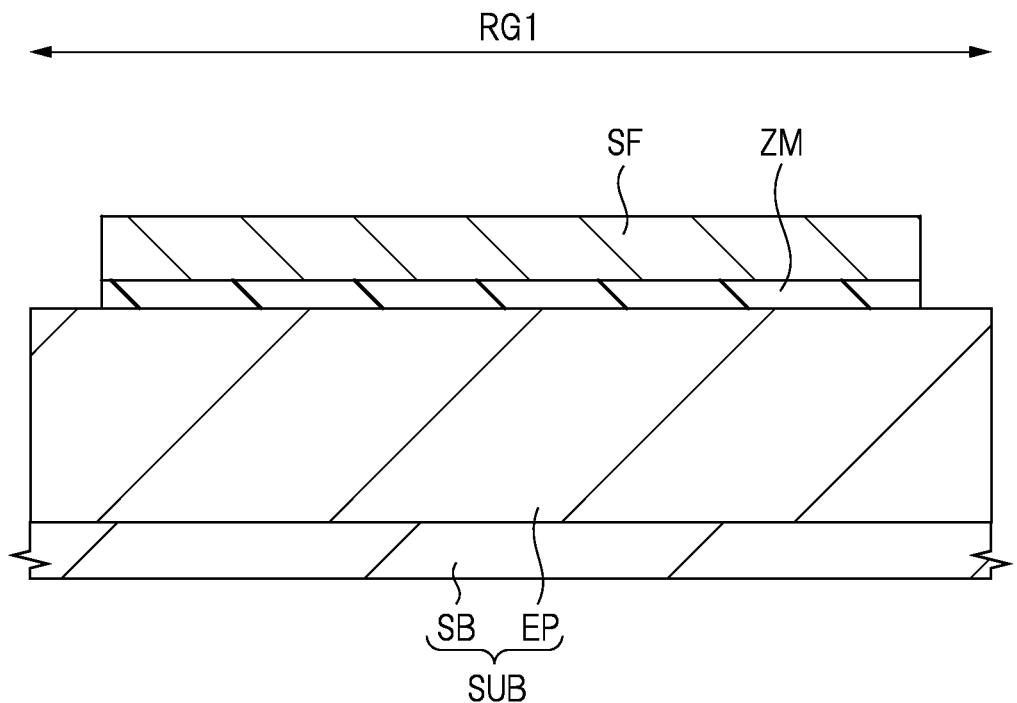
FIG. 19 is a cross-sectional view of a main part of the semiconductor device during the manufacturing process following FIG. 17.
Figure 20:
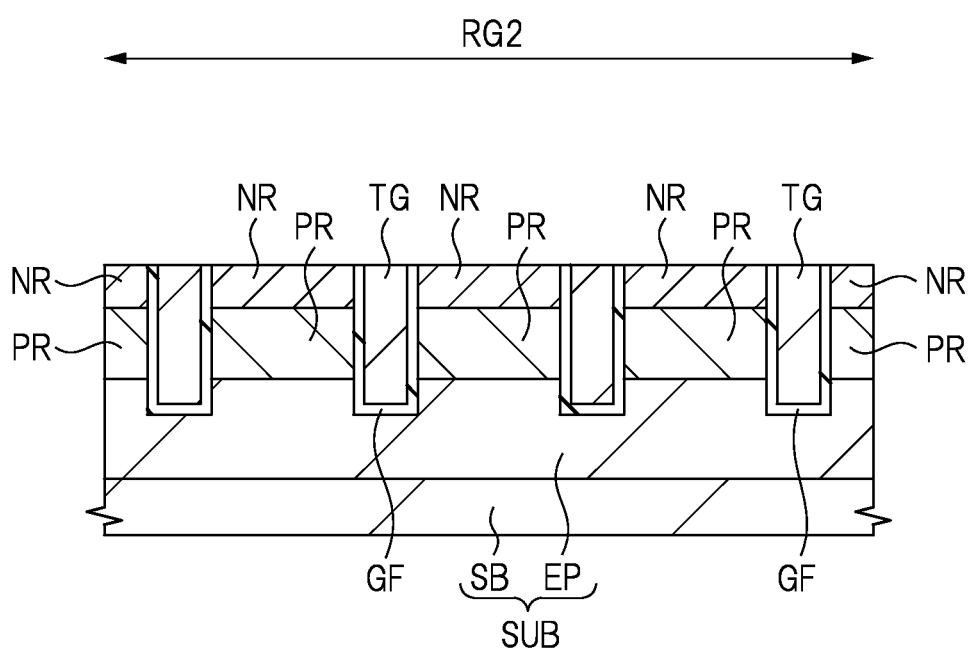
FIG. 20 is a cross-sectional view of a main part of the same semiconductor device as that in FIG. 19 during the manufacturing process.

Next, as shown in FIGS. 19 and 20, in the MOSFET forming region RG2 (FIG. 20), an n⁺ type semiconductor region NR is formed by ion-implanting an n-type impurity into the main surface of the semiconductor substrate SUB. A depth of the n⁺ type semiconductor region NR is shallower than a depth of the p-type semiconductor region PR, and the n⁺ type semiconductor region NR is formed on the p-type semiconductor region PR. At the time of this ion implantation, the silicon film SF in the diode forming region RG1 (FIG. 19) is covered with a photoresist layer (not shown) or the like to prevent the ion implantation from being introduced.

Figure 21:
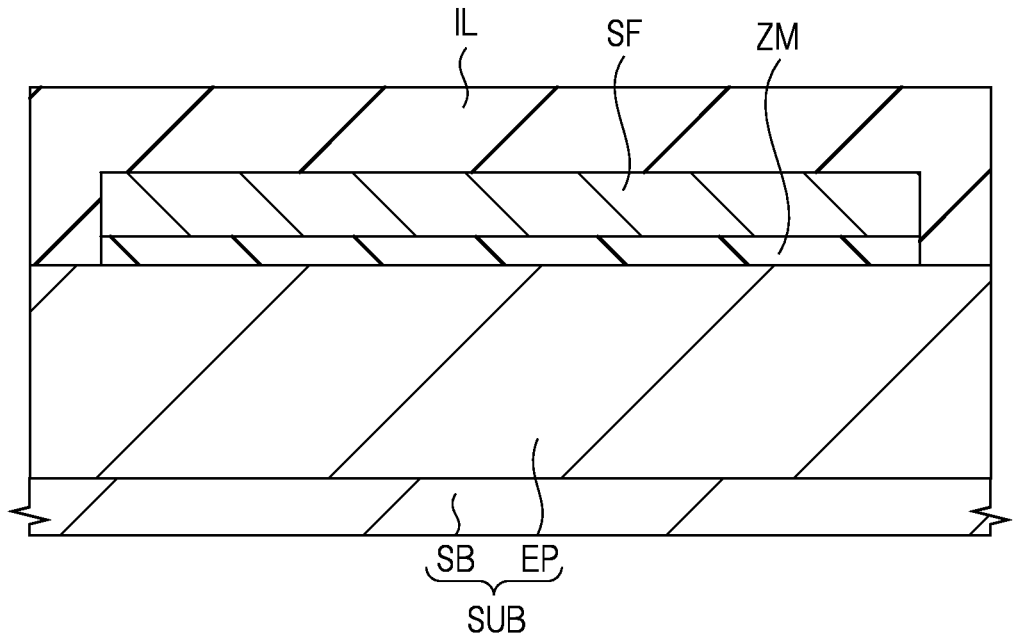
FIG. 21 is a cross-sectional view of a main part of the semiconductor device during the manufacturing process following FIG. 19.
Figure 22:
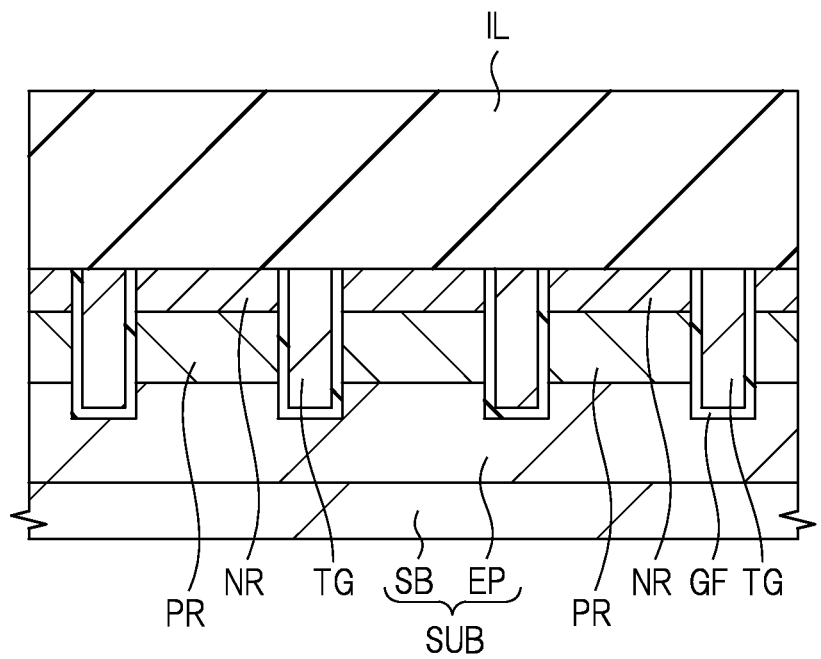
FIG. 22 is a cross-sectional view of a main part of the same semiconductor device as that in FIG. 21 during the manufacturing process.

Next, as shown in FIGS. 21 and 22, an insulating film IL as an interlayer insulating film is formed on the main surface (on the entire main surface) of the semiconductor substrate SUB so as to cover the trench gate electrodes TG and the silicon film SF.

Figure 23:
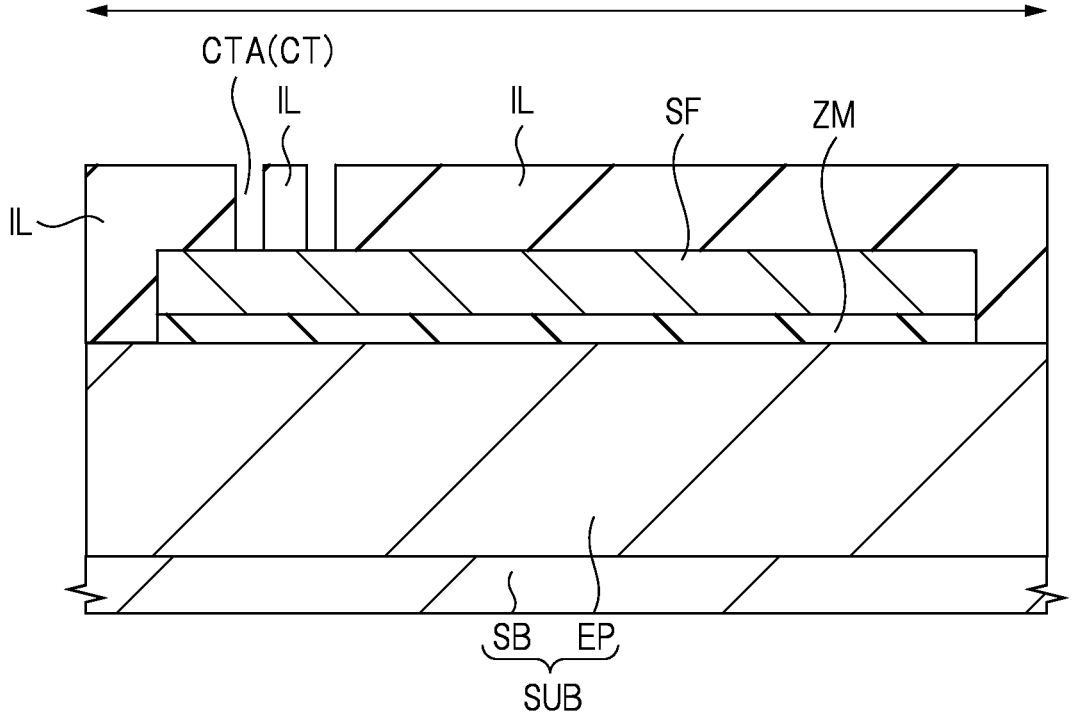
FIG. 23 is a cross-sectional view of a main part of the semiconductor device during the manufacturing process following FIG. 21.
Figure 24:
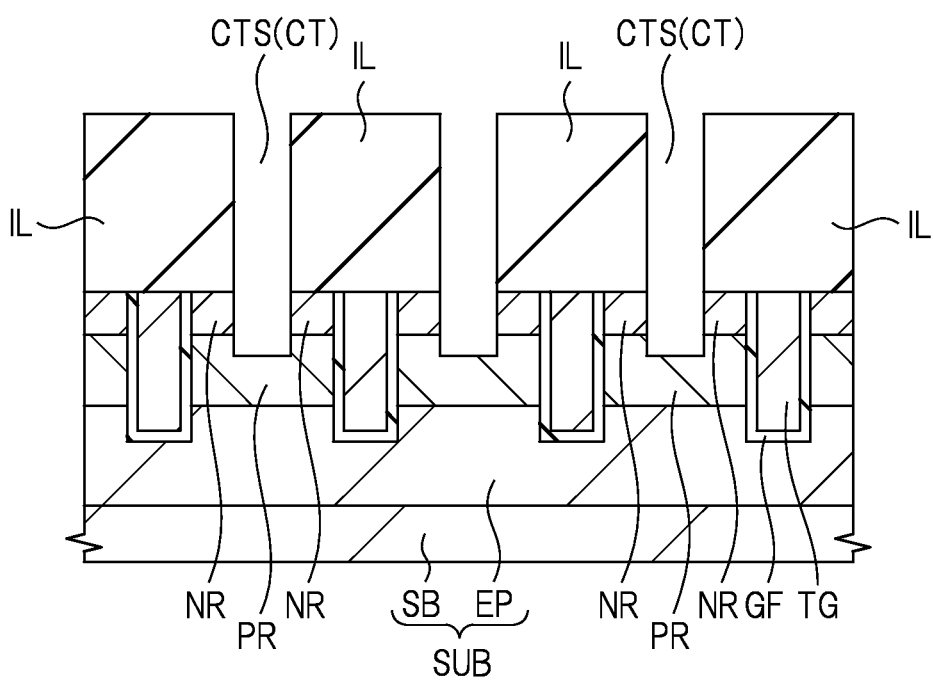
FIG. 24 is a cross-sectional view of a main part of the same semiconductor device as in FIG. 23 during the manufacturing process.

Next, as shown in FIGS. 23 and 24, a contact hole(s) CTS and a contact hole CTA are formed in the insulating film IL by using photolithography technology and etching technology. The contact hole CTS is formed in the MOSFET forming region RG2 (FIG. 24), and the contact hole CTA is formed on the silicon film SF in the diode forming region RG1 (FIG. 23). The contact hole CTS in the MOSFET forming region RG2 and the contact hole CTA in the diode forming region RG1 may be formed in the same step or in separate steps.

Figure 25:
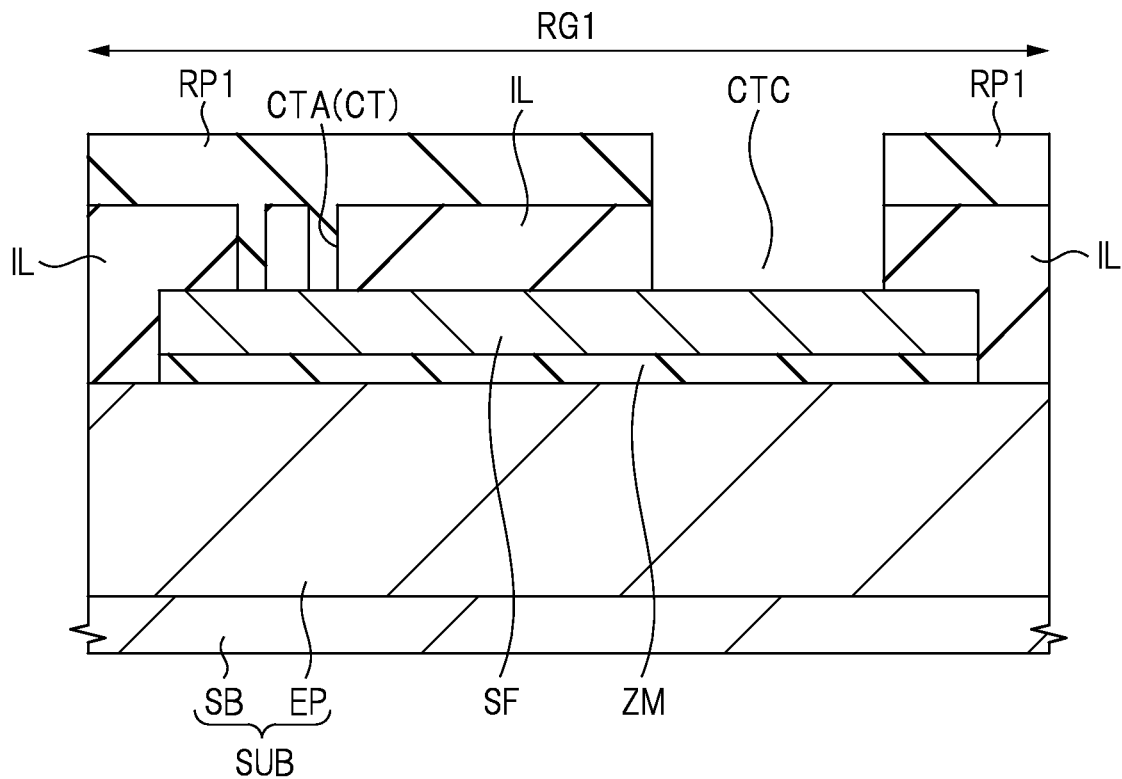
FIG. 25 is a cross-sectional view of a main part of the semiconductor device during the manufacturing process following FIG. 23.
Figure 26:
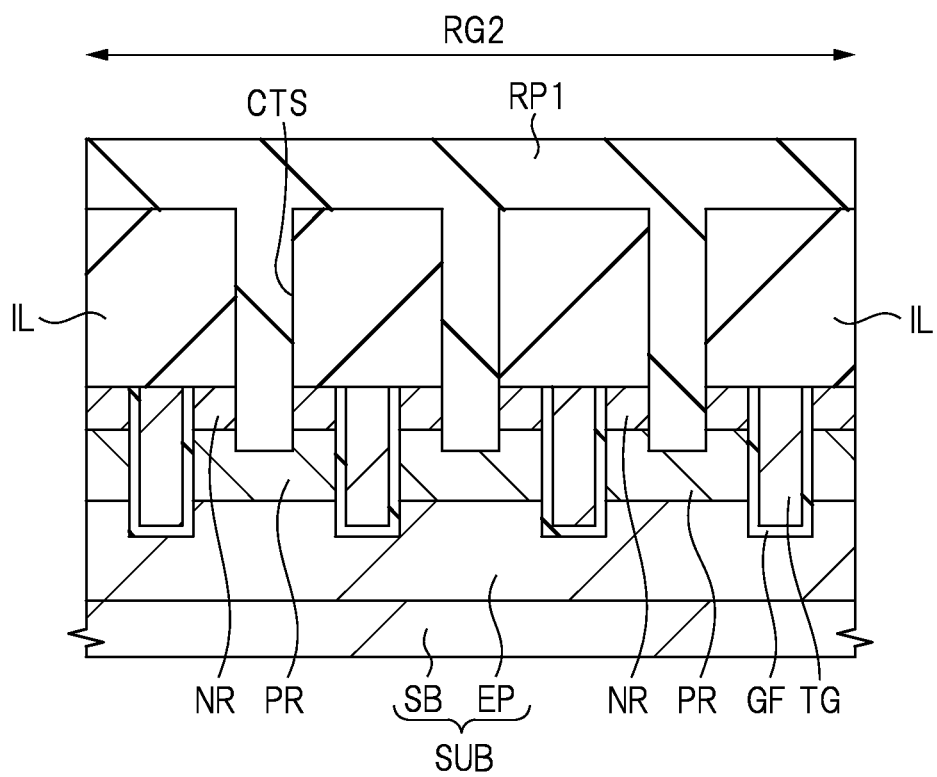
FIG. 26 is a cross-sectional view of a main part of the same semiconductor device as that in FIG. 25 during the manufacturing process.

Next, as shown in FIGS. 25 and 26, a photoresist pattern RP1 is formed on the insulating film IL by a photolithography method, and then the insulating film IL is etched by using the photoresist pattern RP1. In this way, the contact hole CTC is formed in the insulating film IL. The contact hole CTC is formed on the silicon film SF in the diode forming region RG1 (FIG. 25).

Figure 27:
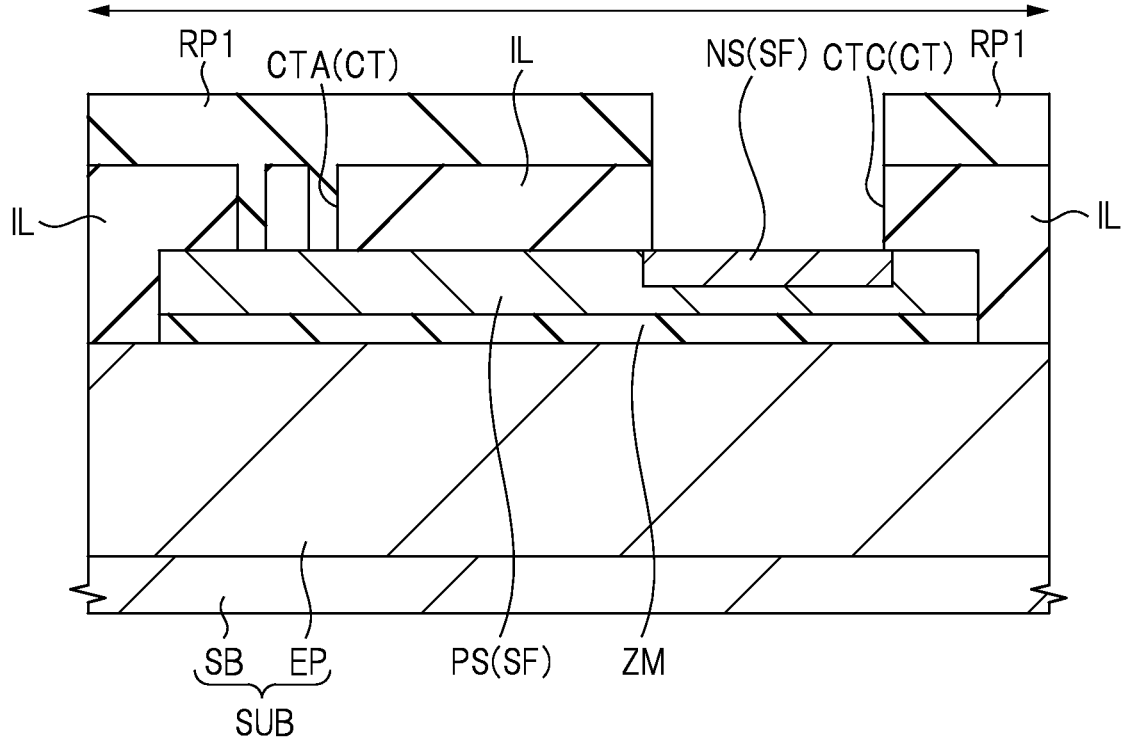
FIG. 27 is a cross-sectional view of a main part of the semiconductor device during the manufacturing process following FIG. 25.
Figure 28:
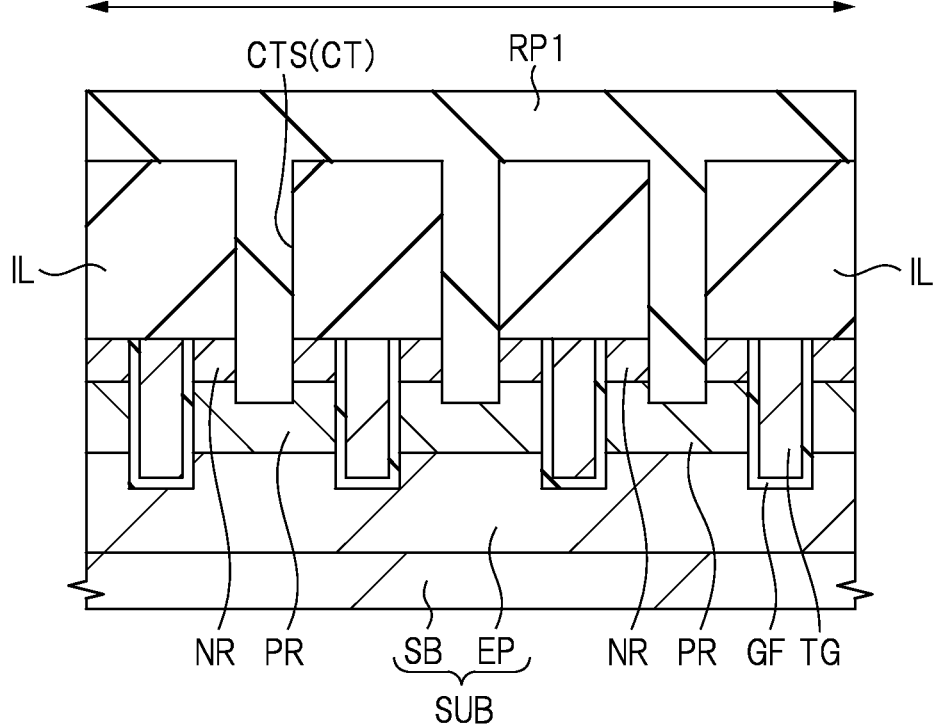
FIG. 28 is a cross-sectional view of a main part of the same semiconductor device as that in FIG. 27 during the manufacturing process.

Next, as shown in FIGS. 27 and 28, by ion-implanting an n-type impurity (for example, arsenic) into the silicon film SF that is exposed from the contact hole CTC, a plurality of n-type silicon regions NS are formed on the silicon film SF. A plurality of contact holes CTC are formed on the silicon film SF, and the same number of n-type silicon regions NS as that of the contact holes CTC is formed on the silicon film SF. The insulating film IL can function as a mask layer for forming the n-type silicon region NS on the silicon film SF by the ion implantation. Further, at the time of this ion implantation, energy of the ion implantation is adjusted so that, in the silicon film SF, a depth position of the bottom surface of the n-type silicon region NS becomes shallower than that of the lower surface of the silicon film SF. That is, a thickness of the n-type silicon region NS is made smaller than a thickness of the silicon film SF.

Before the n-type silicon region NS is formed, the silicon film SF has been a p-type polycrystalline silicon film, and the entire silicon film SF has been a p-type silicon region, so that when the n-type silicon region NS is formed, a portion of the silicon film SF that has not been the n-type silicon region NS becomes the p-type silicon region PS. Consequently, in the diode forming region RG1, a silicon film SF having the p-type silicon region PS and the plurality of n-type silicon regions NS is formed.

Figure 29:
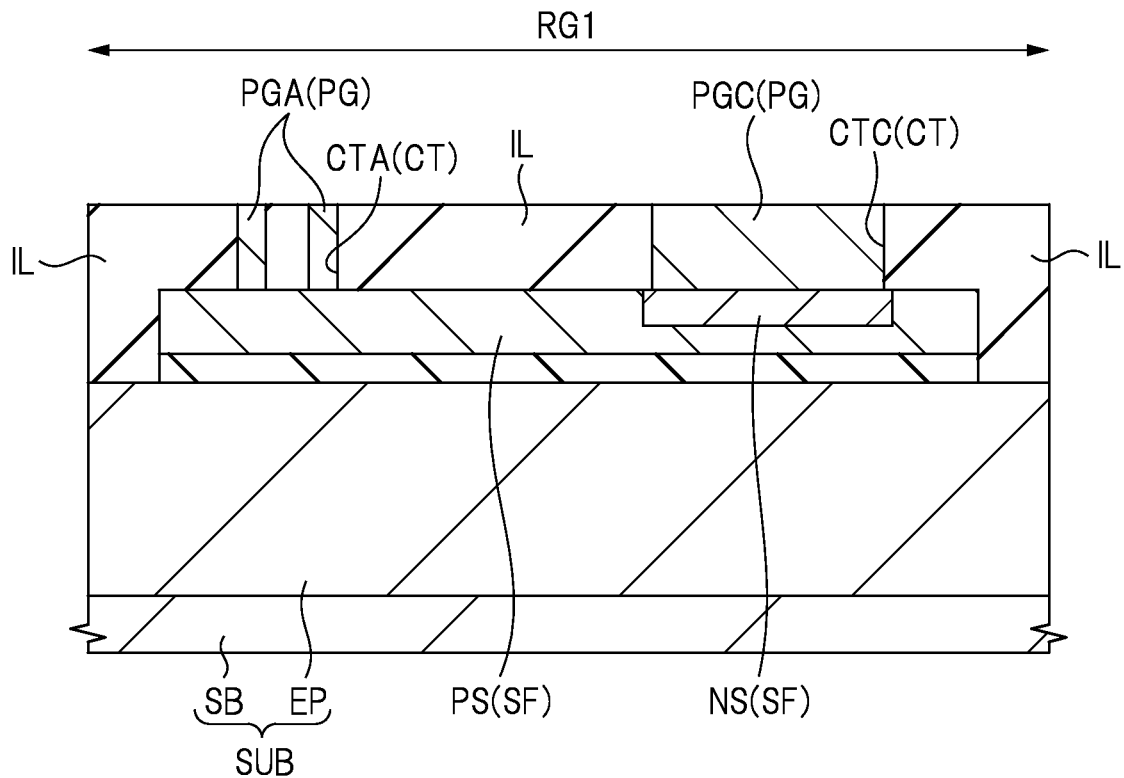
FIG. 29 is a cross-sectional view of a main part of the semiconductor device during the manufacturing process following FIG. 27.
Figure 30:
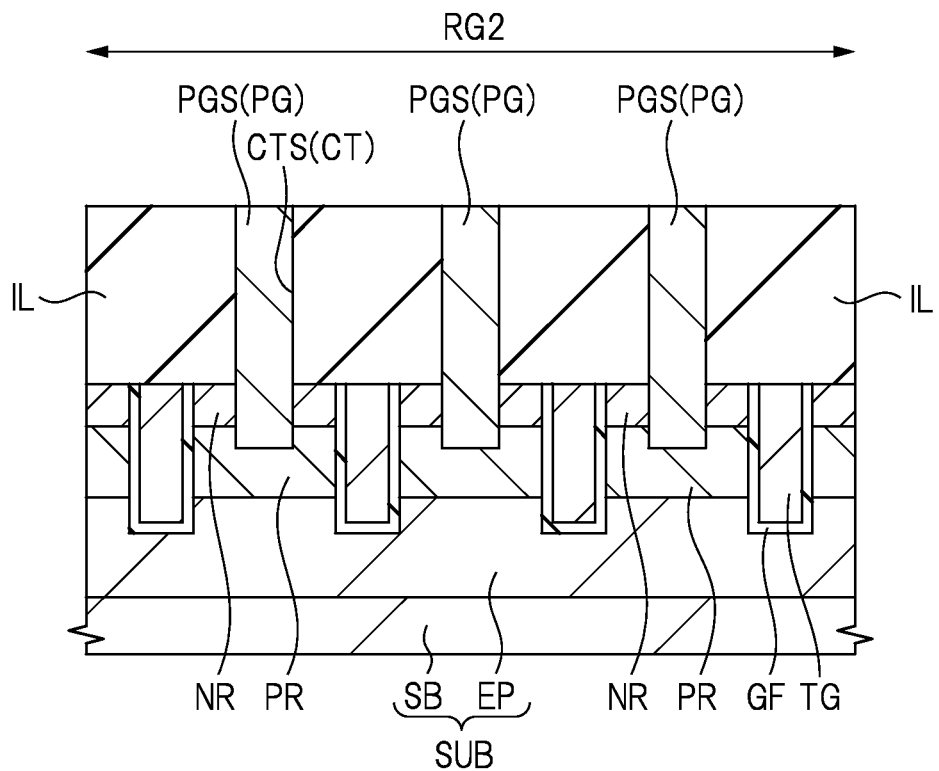
FIG. 30 is a cross-sectional view of a main part of the same semiconductor device as that in FIG. 29 during the manufacturing process.

Next, as shown in FIGS. 29 and 30, a plug PG (PGS, PGA, PGC) is formed in the contact hall CT (CTS, CTA, CTC).

For example, after forming a barrier conductor film on the insulating film IL including the bottom surface and the side wall of the contact hole CT (CTS, CTA, CTC), a main conductor film (for example, tungsten film) is formed on the barrier conductor so as to fill the hall CT (CTS, CTA, CTC). Then, the unnecessary main conductor film and barrier conductor film outside the contact hole CT (CTS, CTA, CTC) are removed by a CMP method or the like. This makes it possible to form the plug PG (PGS, PGA, PGC).

Figure 31:
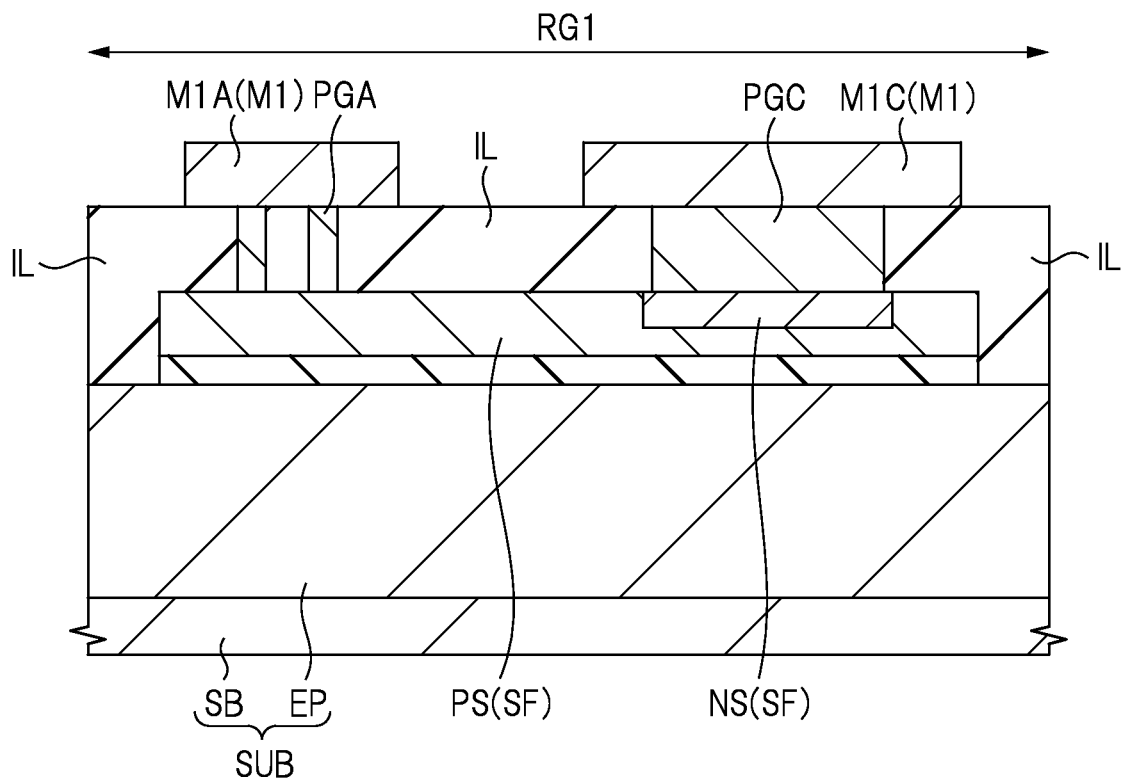
FIG. 31 is a cross-sectional view of a main part of the semiconductor device during the manufacturing process following FIG. 29.
Figure 32:
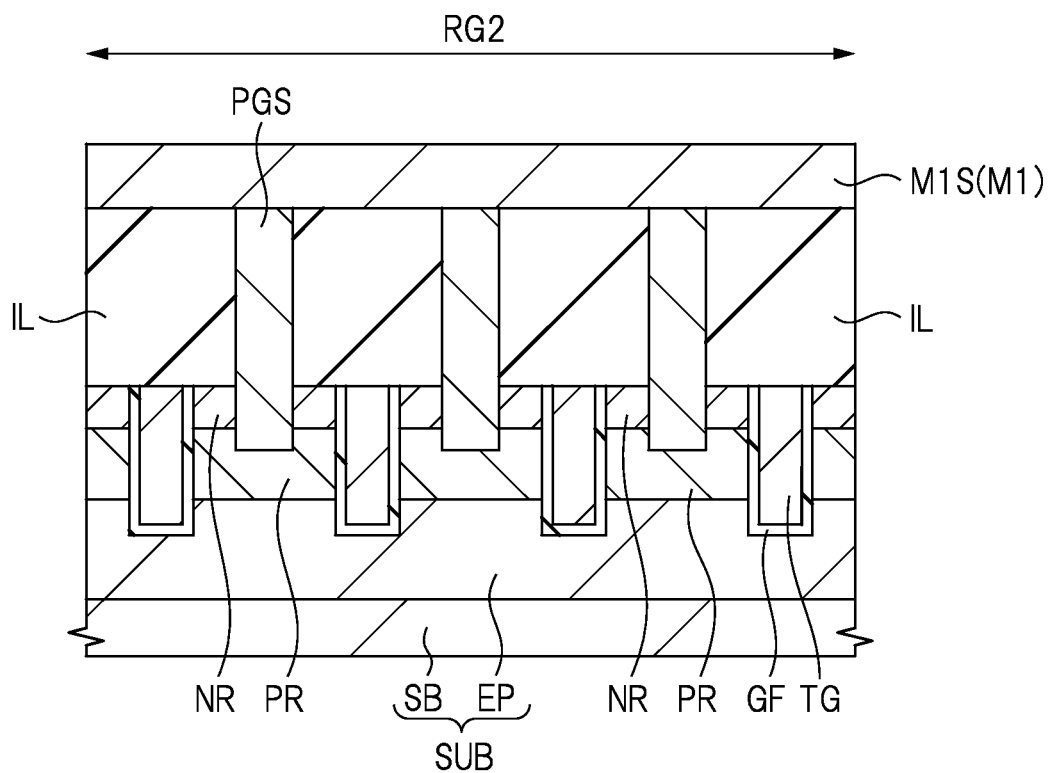
FIG. 32 is a cross-sectional view of a main part of the same semiconductor device as that in FIG. 31 during the manufacturing process.

Next, as shown in FIGS. 31 and 32, a wiring M1 (M1S, M1A, M1C) is formed on the insulating film IL in which the plug PG (PGS, PGA, PGC) is embedded. For example, after a conductive film (for example, an aluminum alloy film) for forming the wiring M1 is formed on the insulating film IL in which the plug PG (PGS, PGA, PGC) is embedded, using the photolithography technology and etching technology to pattern this conductive film makes it possible to form the wiring M1 (M1S, M1A, M1C) made of the patterned conductive film. The illustration and description of the subsequent steps will be omitted here.

Note that after forming a protective film of the uppermost layer, a back surface of the semiconductor substrate SUB is ground or polished, as necessary, to reduce the thickness of the semiconductor substrate SUB, and then a back surface electrode BE can be formed on the entire back surface of the semiconductor substrate SUB. After the back surface electrode BE is formed, the semiconductor substrate SUB is divided (separated and cut) by dicing or the like to acquire individual semiconductor chips (semiconductor devices) from the semiconductor substrate SUB.

Modification Example

Figure 33:
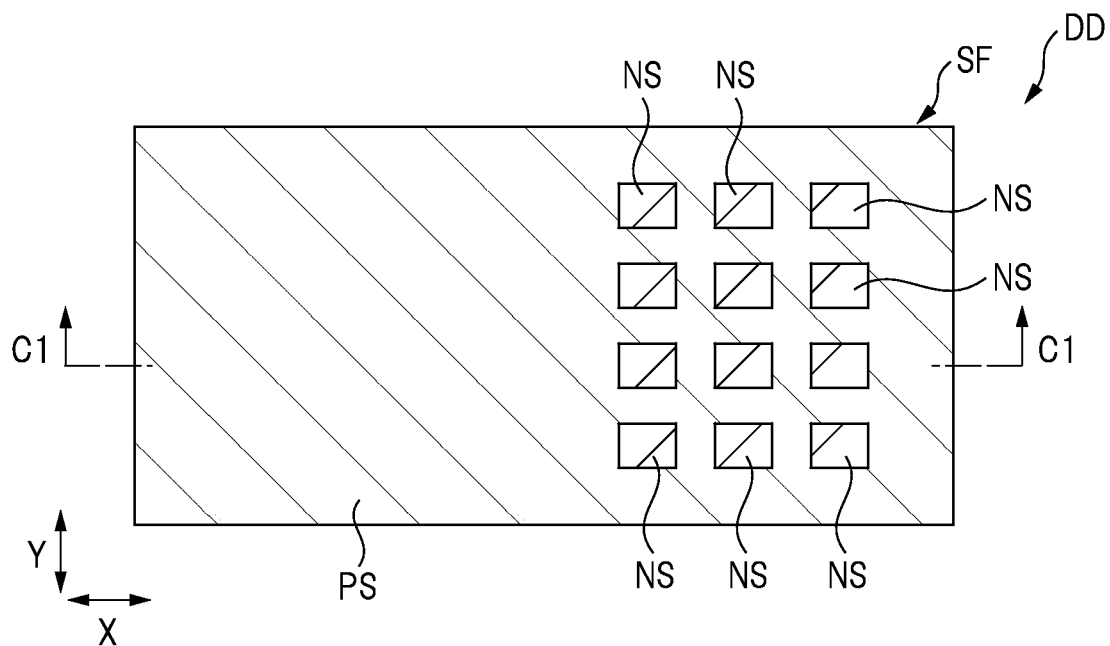
FIG. 33 is a plan view of a main part of a semiconductor device according to a modification example.
Figure 34:
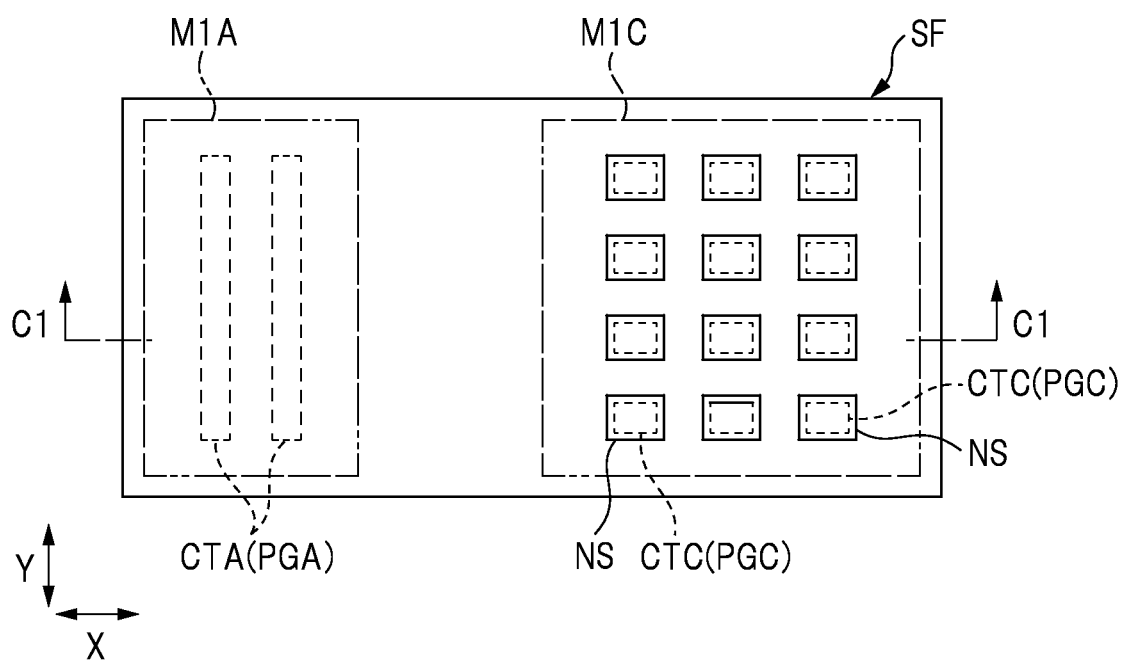
FIG. 34 is a plan view of a main part of a semiconductor device according to a modification example.
Figure 35:
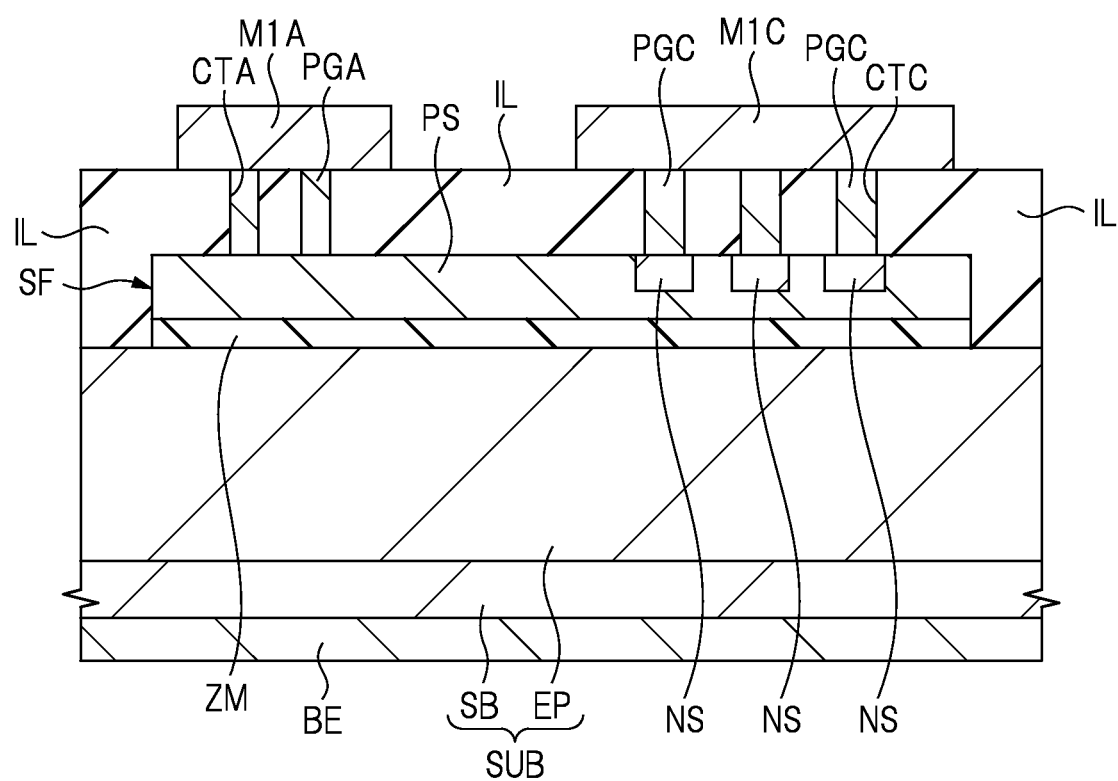
FIG. 35 is a cross-sectional view of a main part of a semiconductor device according to a modification example.

FIGS. 33 and 34 are a plan view of a main part of a modification example of the semiconductor device according to the present embodiment, and FIG. 35 is a cross-sectional view of a main part of the modification example of the semiconductor device according to the present embodiment. FIGS. 33 to 35 correspond to FIGS. 2 to 4 of the first embodiment, respectively. A cross-sectional view taken along line C1-C1 in FIGS. 33 and 34 substantially corresponds to that of FIG. 35.

In a case of the modification example shown in FIGS. 33 to 35, the plurality of n-type silicon regions NS formed on the silicon film SF are arranged in a matrix (mesh shape) in a plan view. The plurality of n-type silicon regions NS arranged in a matrix are electrically connected to the wiring M1C via a plurality of plugs PGC.

Also in the case of the modification examples shown in FIGS. 33 to 35, the total area of the side surfaces of the n-type silicon region NS is increased by increasing the total number of the side surfaces of the n-type silicon region NS, and the total area of the PN junctions constituting the diode DD can be increased by forming the PN junctions not only on the side surface of the n-type silicon region NS but also on the bottom surface thereof.

Further, a matrix arrangement of the plurality of n-type silicon regions NS as shown in FIGS. 33 to 35 can also be applied to a second embodiment described later.

Second Embodiment

Figure 36:
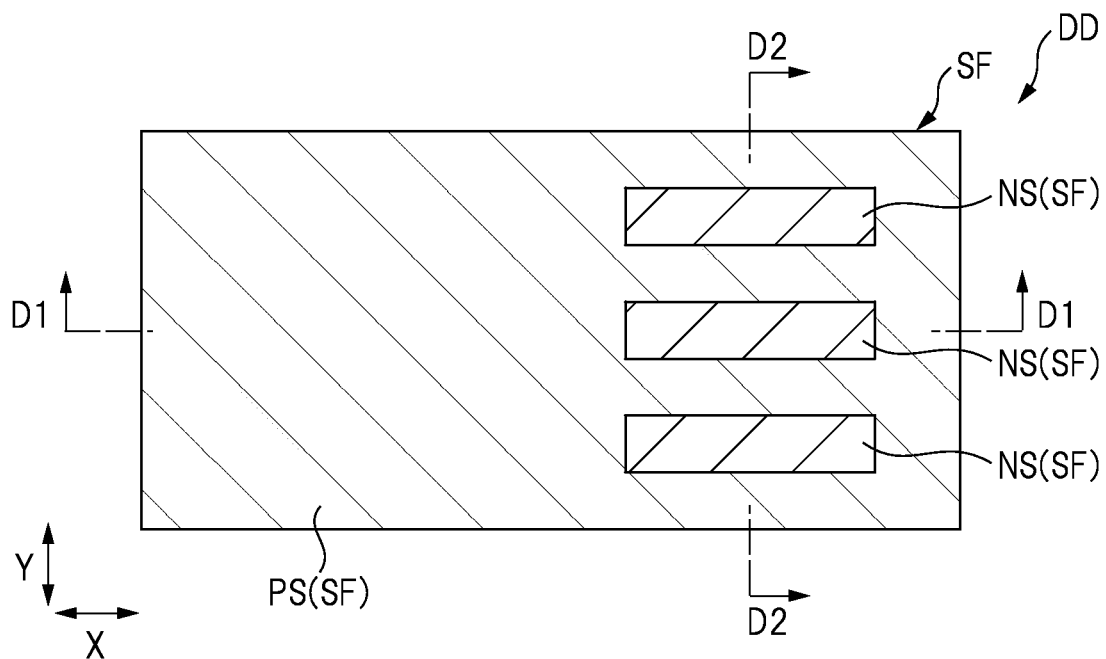
FIG. 36 is a plan view of a main part of a semiconductor device according to another embodiment.
Figure 37:
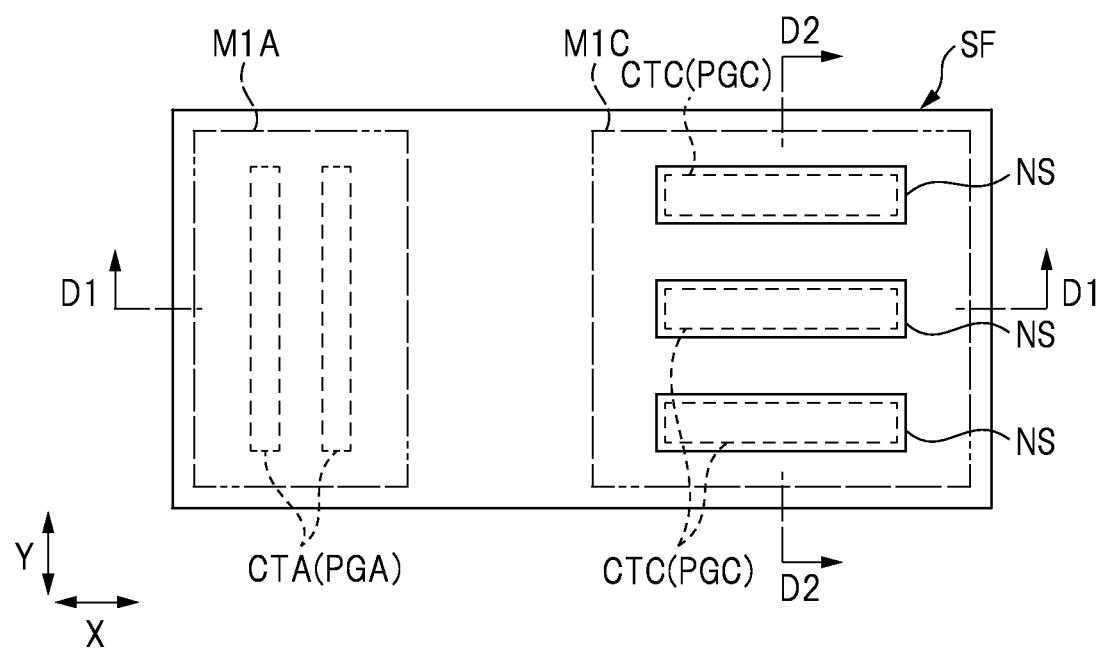
FIG. 37 is a plan view of a main part of the semiconductor device according to the another embodiment.
Figure 38:
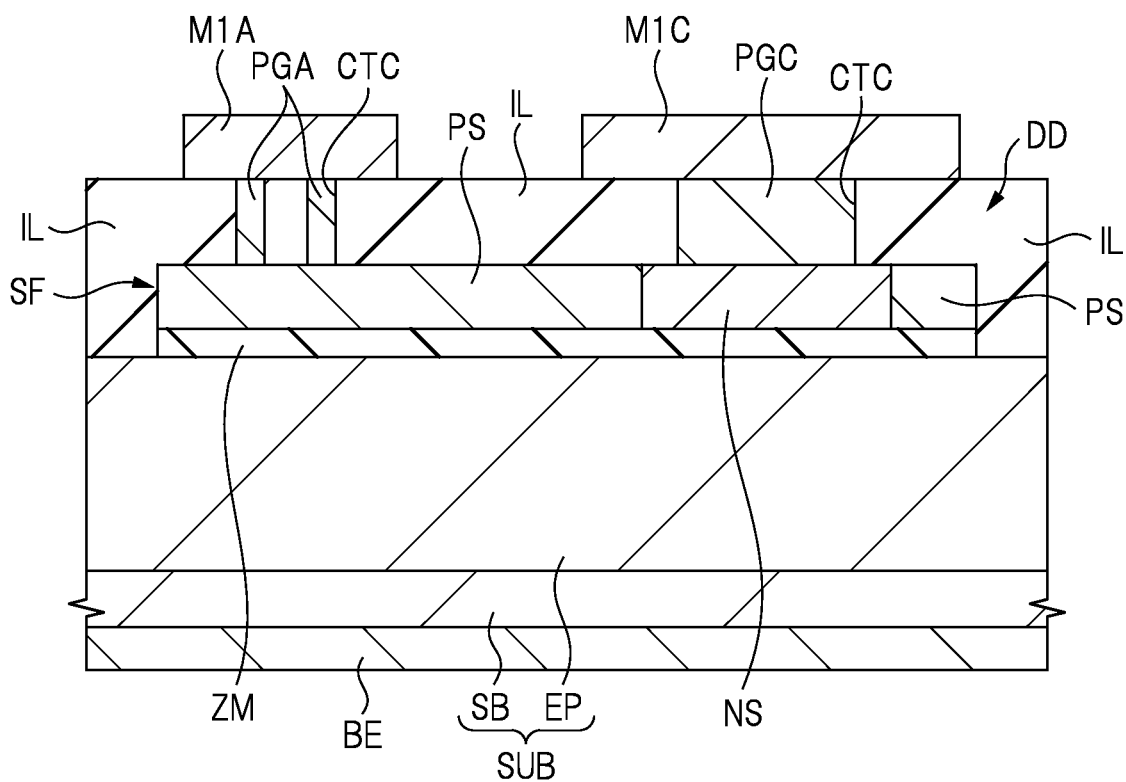
FIG. 38 is a cross-sectional view of a main part of the semiconductor device according to the another embodiment.
Figure 39:
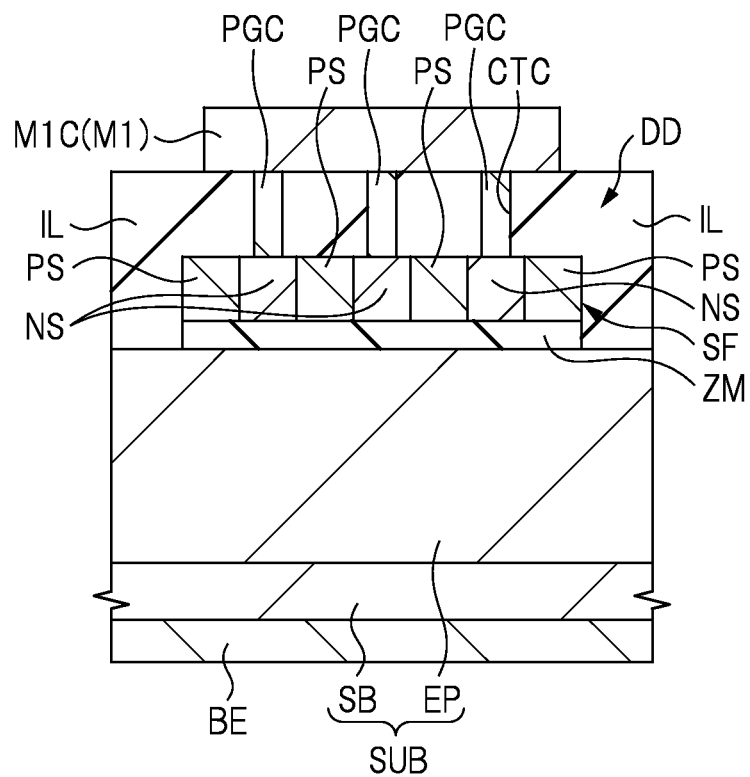
FIG. 39 is a cross-sectional view of a main part of the semiconductor device according to the another embodiment.

FIGS. 36 and 37 are plan views of a main parts of a semiconductor device according to a second embodiment, and FIGS. 38 and 39 are cross-sectional views of the main parts of the semiconductor device according to the second embodiment. FIGS. 36 to 39 correspond to FIGS. 2 to 5 of the first embodiment as described above, respectively. A cross-sectional view at a position of line D1-D1 in each of FIGS. 36 and 37 corresponds substantially to that of FIG. 38, and a cross-sectional view at a position of line D2-D2 in each of FIGS. 36 and 37 corresponds substantially to that of FIG. 39.

Note that a structure of a semiconductor device according to a second embodiment is almost the same as that of the semiconductor device CP of the first embodiment except for a structure of the diode DD. Therefore, in the second embodiment, a point different from the first embodiment about the structure of the diode DD will be mainly described below.

Also in the second embodiment, the silicon film SF constituting the diode DD has a p-type silicon region PS and a plurality of n-type silicon regions NS, each of the plurality of n-type silicon regions NS being surrounded by the p-type silicon region PS in a plan view.

In the above-mentioned first embodiment, a depth position of the bottom surface of each of the plurality of n-type silicon regions NS formed in the silicon film SF is shallower than that of the lower surface of the silicon film SF and, accordingly, each of the plurality of n-type silicon regions has not penetrated the silicon film SF in the thickness direction of the silicon film SF. Consequently, in the above-mentioned first embodiment, each n-type silicon region NS has not been exposed on the lower surface of the silicon film SF, and the p-type silicon region PS has existed under the bottom surface of each n-type silicon region NS.

In contrast, in the present second embodiment, each of the plurality of n-type silicon regions NS is formed so as to penetrate the silicon film SF in the thickness direction of the silicon film SF. That is, the thickness of each n-type silicon region NS is substantially the same as the thickness of the silicon film SF. Consequently, in the present second embodiment, each of the plurality of n-type silicon regions NS formed on the silicon film SF is exposed on the upper surface of the silicon film SF and is exposed on the lower surface of the silicon film SF. Therefore, in the present second embodiment, the p-type silicon region PS does not exist under each n-type silicon region NS.

For this reason, in the above-mentioned first embodiment, the side surface and the bottom surface of each n-type silicon region NS contact with the p-type silicon region PS, and the PN junctions are formed on the side surface and the bottom surface of each n-type silicon region NS. In contrast, in the present second embodiment, the side surface of each n-type silicon region NS contacts with the p-type silicon region PS, and the PN junction is formed on the side surface of each n-type silicon region NS. However, the bottom surface of each n-type silicon region NS does not contact with the p-type silicon region PS and, accordingly, no PN junction is formed on the bottom surface of each n-type silicon region NS.

Besides the above description, a configuration of the semiconductor device according to the second embodiment is almost the same as that of the semiconductor device CP according to the above-mentioned first embodiment, so that a repetitive description thereof will be omitted here.

Also in the second embodiment, a plurality of n-type silicon regions NS are provided in the silicon film SF for the diode DD so that each of the plurality of n-type silicon regions NS is surrounded by the p-type silicon region PS in a plan view. This makes it possible to increase the total number of side surfaces of the n-type silicon regions NS on which the PN junctions are formed and, accordingly, to increase the total area of the side surfaces of the n-type silicon regions NS in which the PN junctions are formed. For this reason, the total area of the PN junctions constituting the diode DD can be increased. In other words, the total area of the PN junctions constituting the diode DD can be increased while the plane dimensions (plane area) of the silicon film SF is suppressed. Consequently, since the operating resistance of the diode DD can be reduced, the heat generation amount of the diode DD can be suppressed. Therefore, the reliability of the diode DD can be improved and, accordingly, the reliability of the semiconductor device CP including the diode DD can be improved. Moreover, the performance of the semiconductor device can be improved. In addition, the semiconductor device can be miniaturized (made small in area).

However, in the first embodiment, the PN junction is formed not only on the side surface of each n-type silicon region NS but also on the bottom surface thereof, whereas in the second embodiment, the PN junction is formed on the side surface of each n-type silicon region NS and no PN junction is formed on the bottom surface of each n-type silicon region NS. Consequently, when the first embodiment and the second embodiment are compared, the first embodiment can make the total area of the PN junctions constituting the diode DD larger than that of the second embodiment because the PN junction is formed also on the bottom surface of each n-type silicon region NS. Thus, since the operating resistance of the diode DD in the first embodiment is made smaller (lower) than that in the second embodiment, the heat generation amount of the diode DD can be further suppressed. Therefore, in improving the reliability of the semiconductor device CP including the diode DD, the first embodiment is more advantageous than the second embodiment.

Next, an example of a manufacturing process according to a second embodiment will be described with reference to FIGS. 40 to 49. Each of FIGS. 40 to 49 is a cross-sectional view of the main part of the semiconductor device according to the second embodiment during a manufacturing process. Note that FIGS. 40, 42, 44, 46 and 48 among FIGS. 40 to 49 show cross sections corresponding to that of FIG. 38 (hence, a cross section of the diode forming region RG1) as described above. Further, FIGS. 41, 43, 45, 47 and 49 among FIGS. 40 to 49 show cross sections corresponding to that FIG. 39 (hence, a cross section of the MOSFET forming region RG2) as described above.

Since the manufacturing process of the present second embodiment is the same as the manufacturing process of the above-mentioned first embodiment until the structures of FIGS. 17 and 18 are obtained, a repetitive description thereof will be omitted here.

Figure 40:
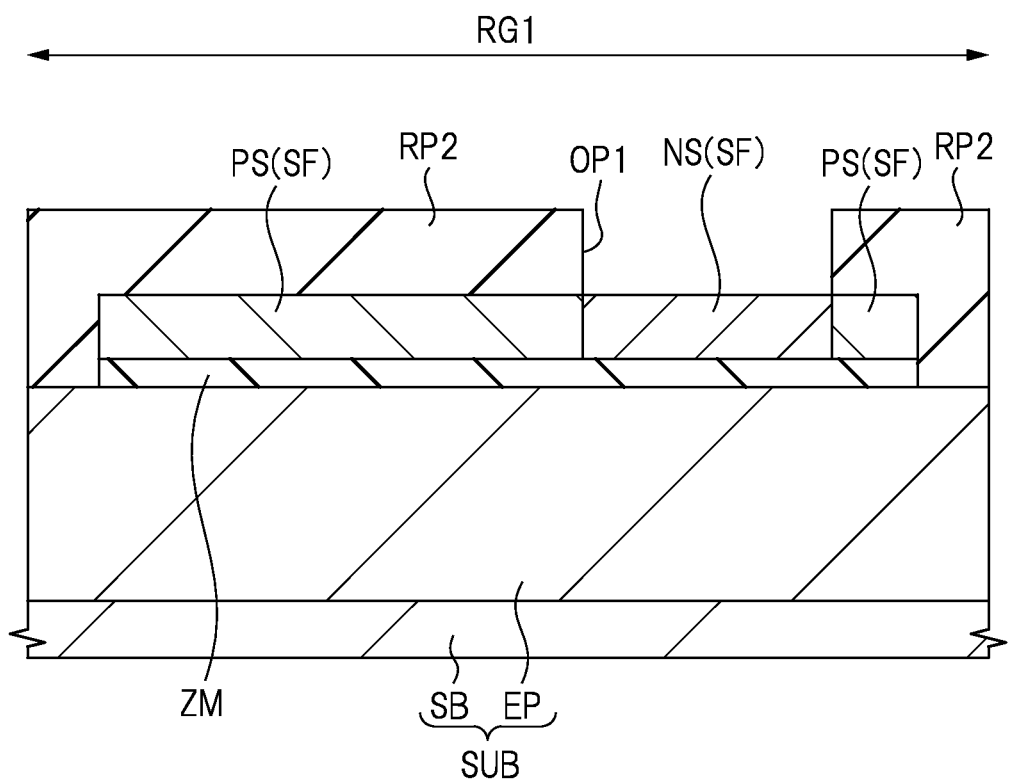
FIG. 40 is a cross-sectional view of a main part of a semiconductor device according to another embodiment during a manufacturing process.
Figure 41:
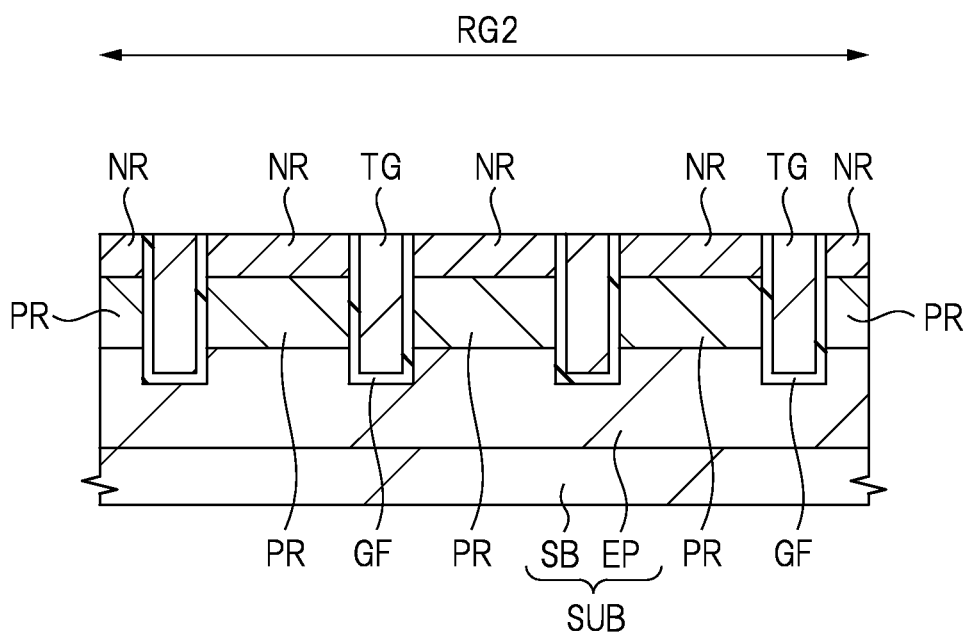
FIG. 41 is a cross-sectional view of a main part of the same semiconductor device as that in FIG. 40 during the manufacturing process.

After obtaining the structures of FIGS. 17 and 18 in the same manner as in the first embodiment, as shown in FIGS. 40 and 41 in the present second embodiment, the MOSFET forming region RG2 (FIG. 41) is exposed, and a photoresist pattern (mask layer) RP2 covering the silicon film SF in the diode forming region RG1 (FIG. 40) is formed by using a photolithography technique. The photoresist pattern RP2 has an opening OP1 exposing a region in which the n-type silicon region NS in the silicon film SF should be exposed.

Next, an ion implantation step for forming the $n^+$ type semiconductor region NR and the n-type silicon region NS is performed. In this ion implantation step, an n-type impurity (for example, arsenic) is ion-implanted. By this ion injection step, in the MOSFET forming region RG2, the n-type impurity is injected into the semiconductor substrate SUB (specifically, the upper portion of the p-type semiconductor region PR) to form the $n^+$ type semiconductor region NR and, in the diode forming region RG1, the n-type impurity is injected into the silicon film SF of the portion exposed from the opening OP1 of the photoresist pattern RP2 to form the n-type silicon region NS. Since the plurality of openings OP1 are formed on the silicon film SF, a plurality of n-type silicon regions NS are formed on the silicon film SF. The photoresist pattern RP2 can function as a mask layer for forming the plurality of n-type silicon regions NS on the silicon film SF by the ion implantation. Further, in this ion implantation step, adjusting energy of the ion implantation is desired so that the $n^+$ type semiconductor region NR functioning as a source region has an appropriate thickness.

Figure 42:
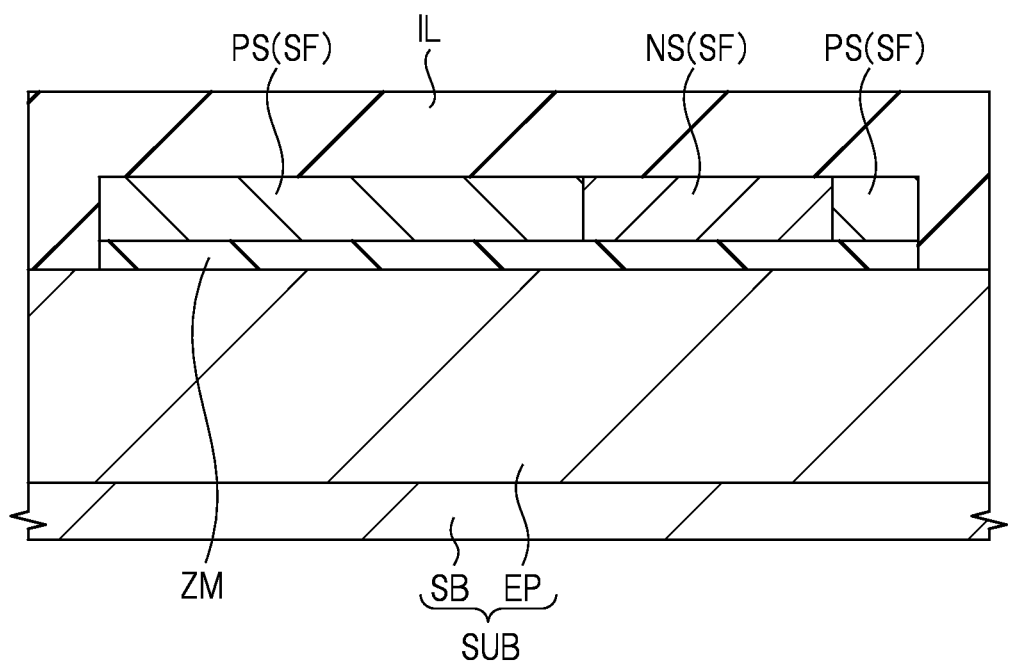
FIG. 42 is a cross-sectional view of a main part of the semiconductor device during the manufacturing process following FIG. 40.
Figure 43:
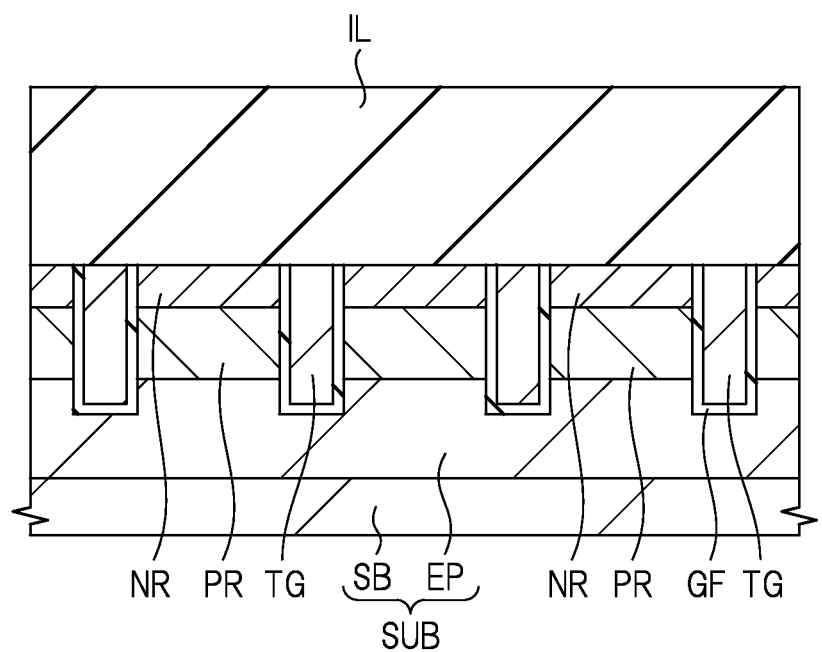
FIG. 43 is a cross-sectional view of a main part of the same semiconductor device as that in FIG. 42 during the manufacturing process.

Next, as shown in FIGS. 42 and 43, the insulating film IL as an interlayer insulating film is formed on the main surface (over the entire main surface) of the semiconductor substrate SUB so as to cover the trench gate electrode TG and the silicon film SF.

Figure 44:
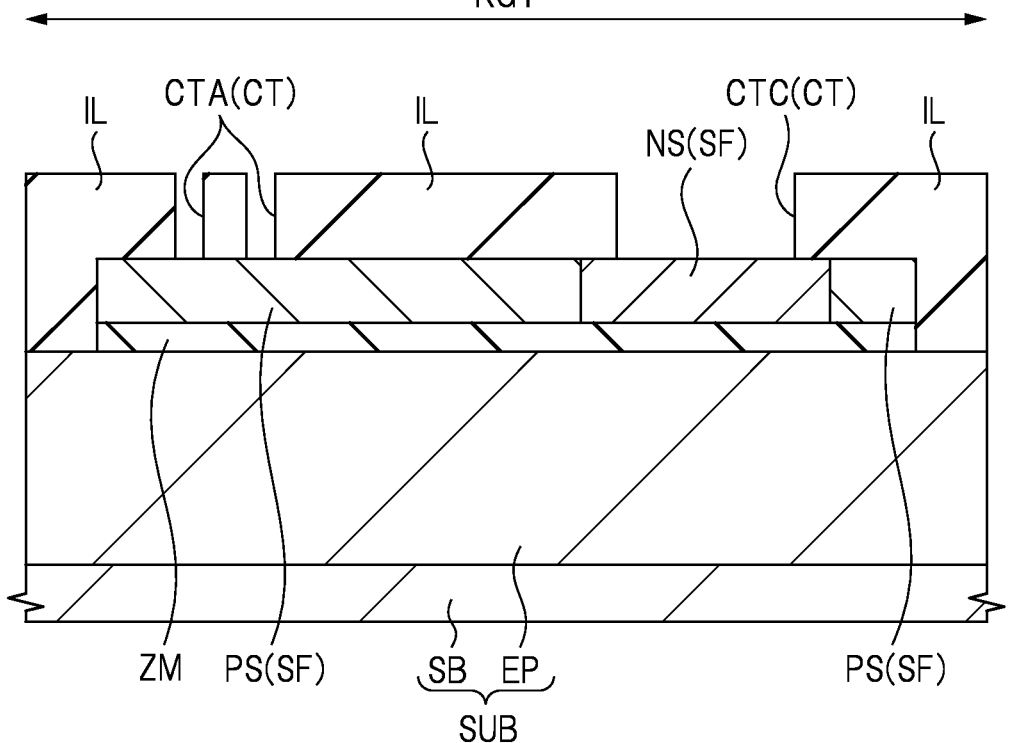
FIG. 44 is a cross-sectional view of a main part of the semiconductor device during the manufacturing process following FIG. 42.
Figure 45:
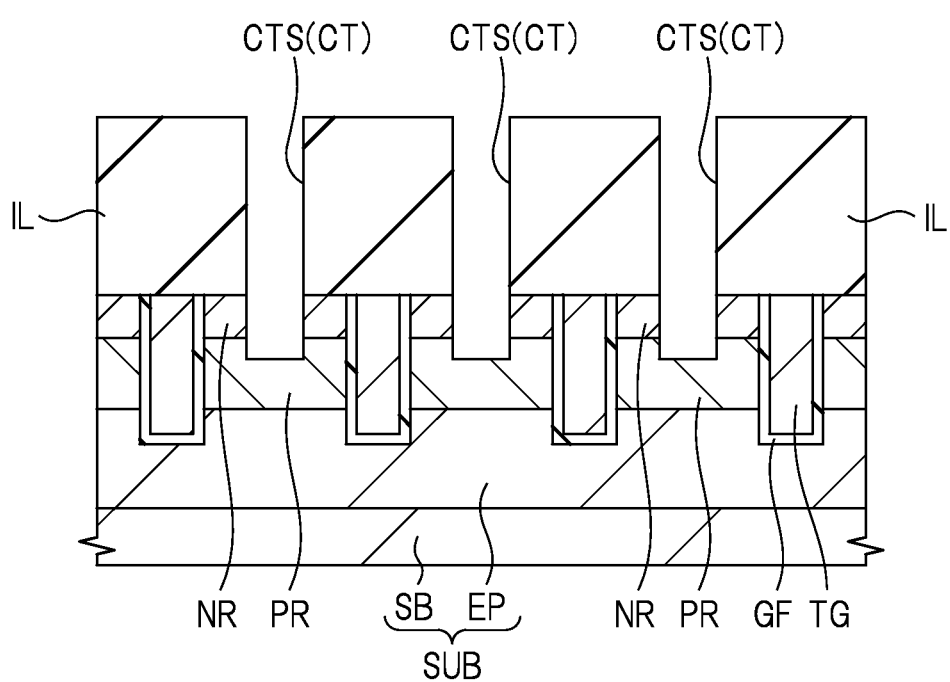
FIG. 45 is a cross-sectional view of a main part of the same semiconductor device as that in FIG. 44 during the manufacturing process.

Next, as shown in FIGS. 44 and 45, the contact holes CTS, CTA, and CTC are formed in the insulating film IL by using the photolithography technology and etching technology. The contact hole CTS is formed in the MOSFET forming region RG2 (FIG. 45), and the contact holes CTA and CTC are formed on the silicon film SF in the diode forming region RG1 (FIG. 44). The contact hole CTA and the contact hole CTC can be formed in the same process. The contact hole CTS may be formed in the same step as the contact holes CTA and CTC or in separate steps.

Figure 46:
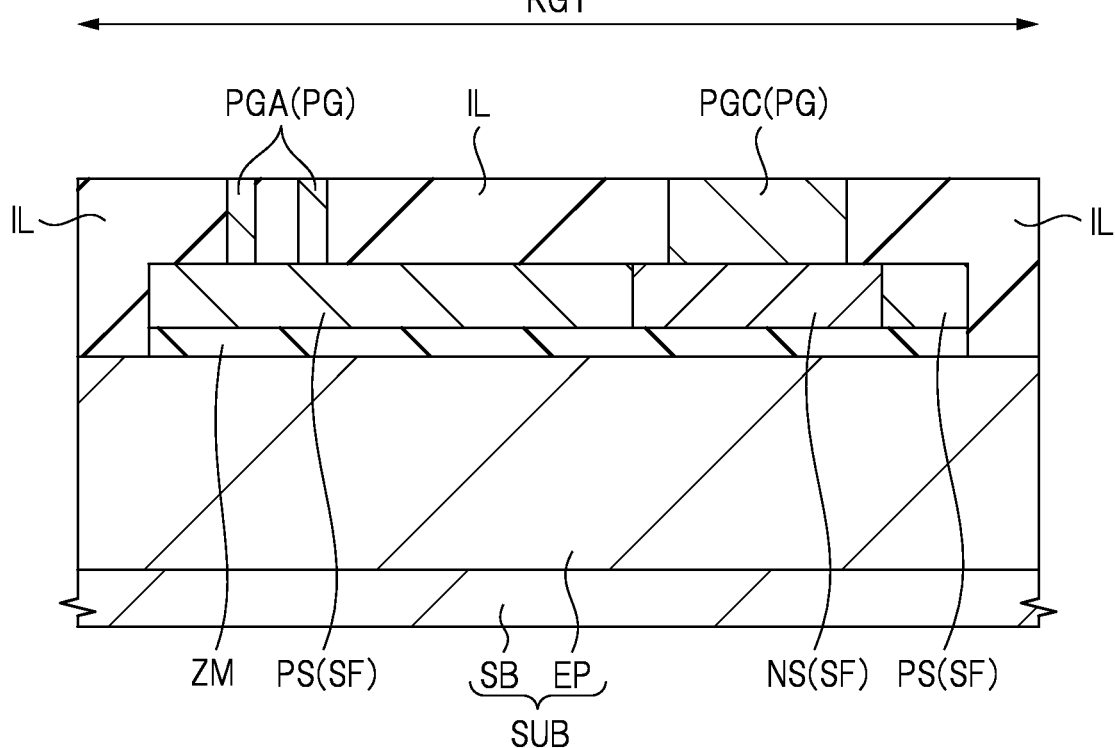
FIG. 46 is a cross-sectional view of a main part of the semiconductor device during the manufacturing process following FIG. 44.
Figure 47:
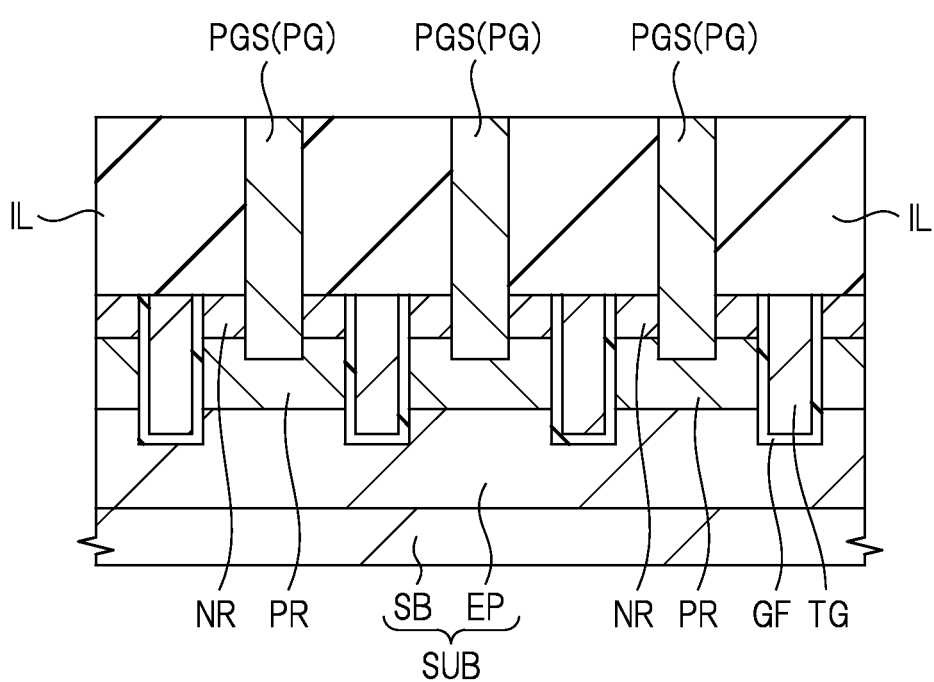
FIG. 47 is a cross-sectional view of a main part of the same semiconductor device as that in FIG. 46 during the manufacturing process.
Figure 48:
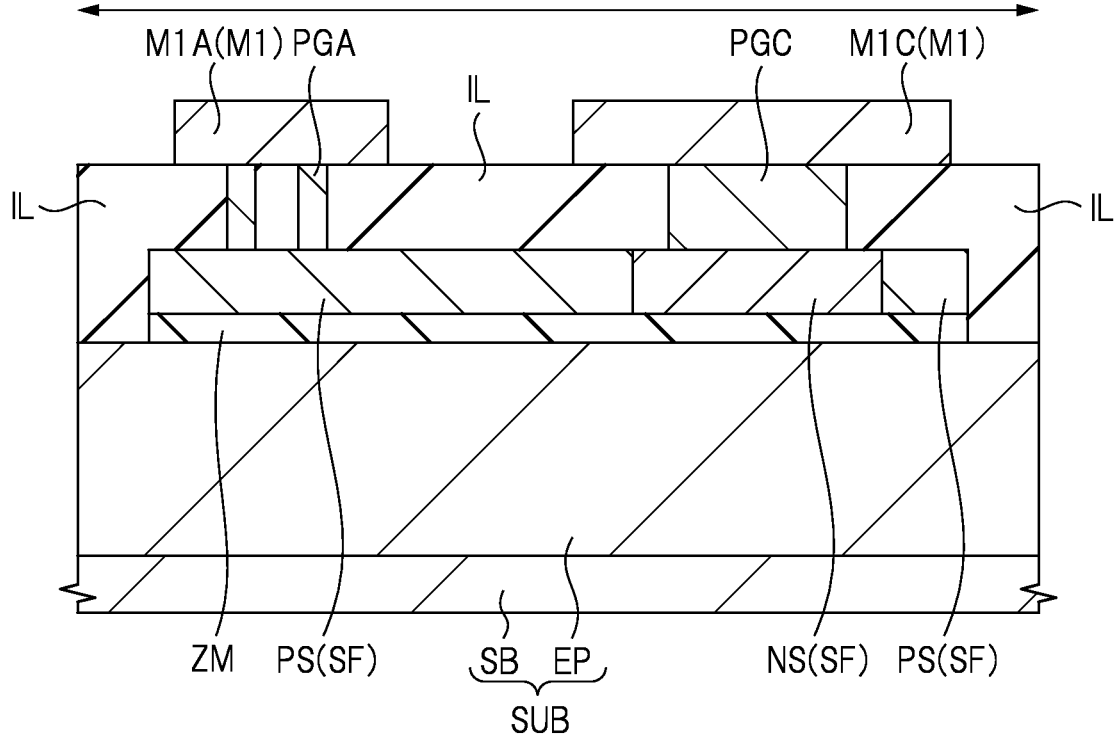
FIG. 48 is a cross-sectional view of a main part of the semiconductor device during the manufacturing process following FIG. 46.
Figure 49:
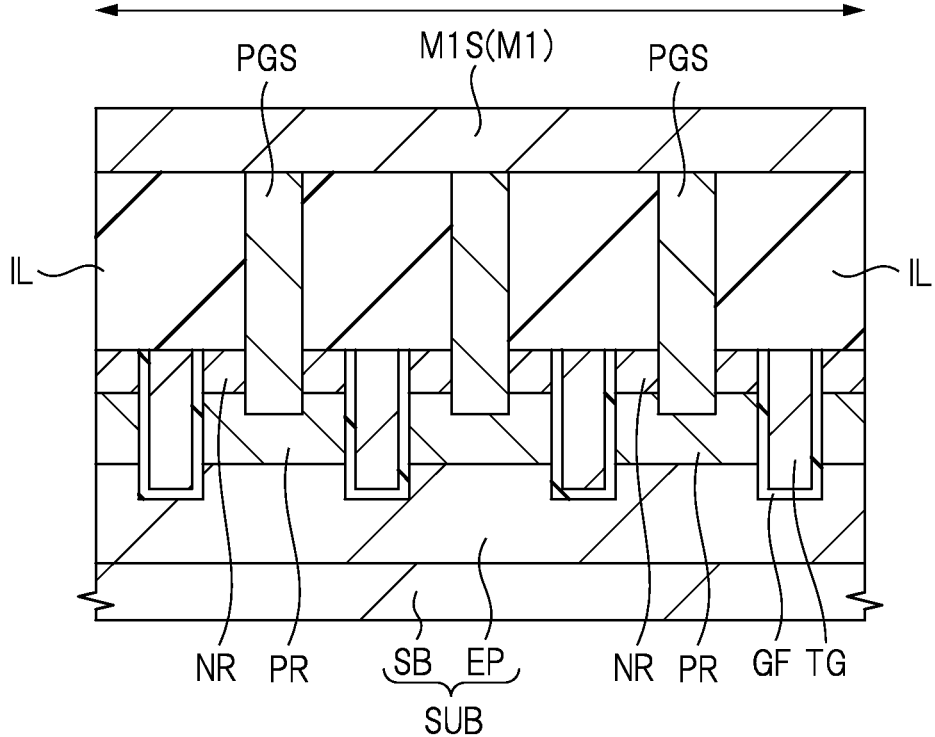
FIG. 49 is a cross-sectional view of a main part of the same semiconductor device as that in FIG. 48 during the manufacturing process.

The subsequent steps in the second embodiment are almost the same as those in the first embodiment. That is, as shown in FIGS. 46 and 47, the plug PG (PGS, PGA, PGC) is formed in the contact hall CT (CTS, CTA, CTC) in the same manner as in the above-mentioned first embodiment. Then, as shown in FIGS. 48 and 49, the wiring M1 (M1S, M1A, M1C) is formed on the insulating film IL, in which the plug PG (PGS, PGA, PGC) is embedded, in the same manner as in the first embodiment.

In the present second embodiment, the ion implantation step for forming the plurality of n-type silicon regions NS in the silicon film SF is performed is set at the same as the ion implantation step for forming the $n^+$ type semiconductor region NR in the semiconductor substrate SUB of the MOSFET forming region RG2 is performed. This brings obtaining an advantage of being capable of reducing the number of ion implantation steps in the case of the manufacturing process of the present second embodiment.

Meanwhile, in the case of the first embodiment, the ion implantation step for forming the plurality of n-type silicon regions NS in the silicon film SF can adjust the energy of the ion implantation according to the thickness of the n-type silicon region NS to be formed. Consequently, it is easy to control the depth position of the bottom surface of the n-type silicon region NS. Therefore, it is possible to more accurately form a structure, in which the depth position of the bottom surface of the n-type silicon region NS is shallower than that of the lower surface of the silicon film SF, as described in the first embodiment.

Third Embodiment

Figure 50:
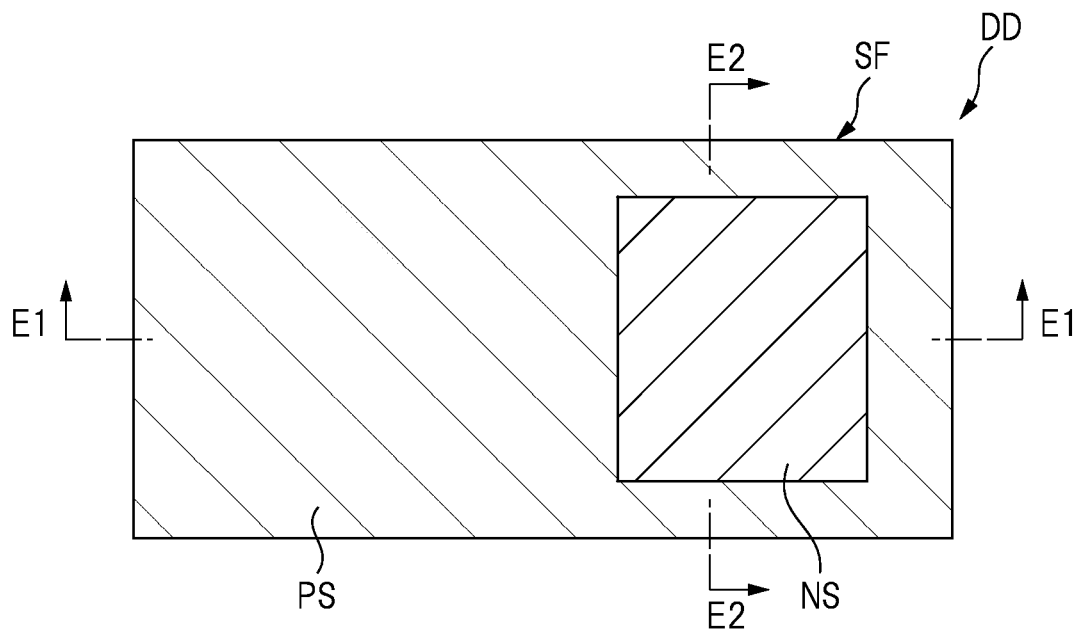
FIG. 50 is a plan view of a main part of a semiconductor device according to yet another embodiment.
Figure 51:
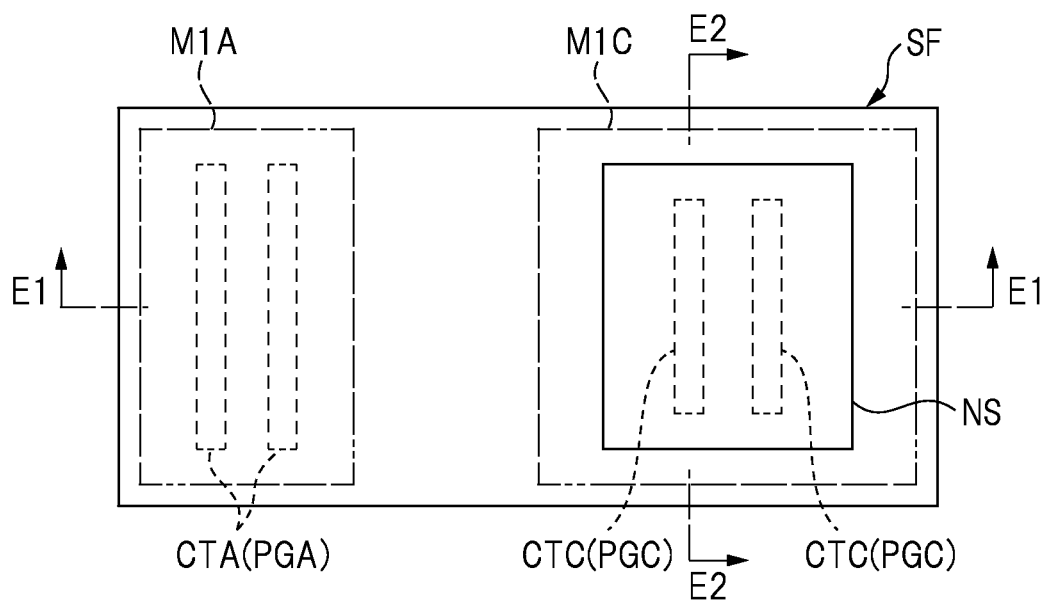
FIG. 51 is a plan view of a main part of the semiconductor device according to the yet another embodiment.
Figure 52:
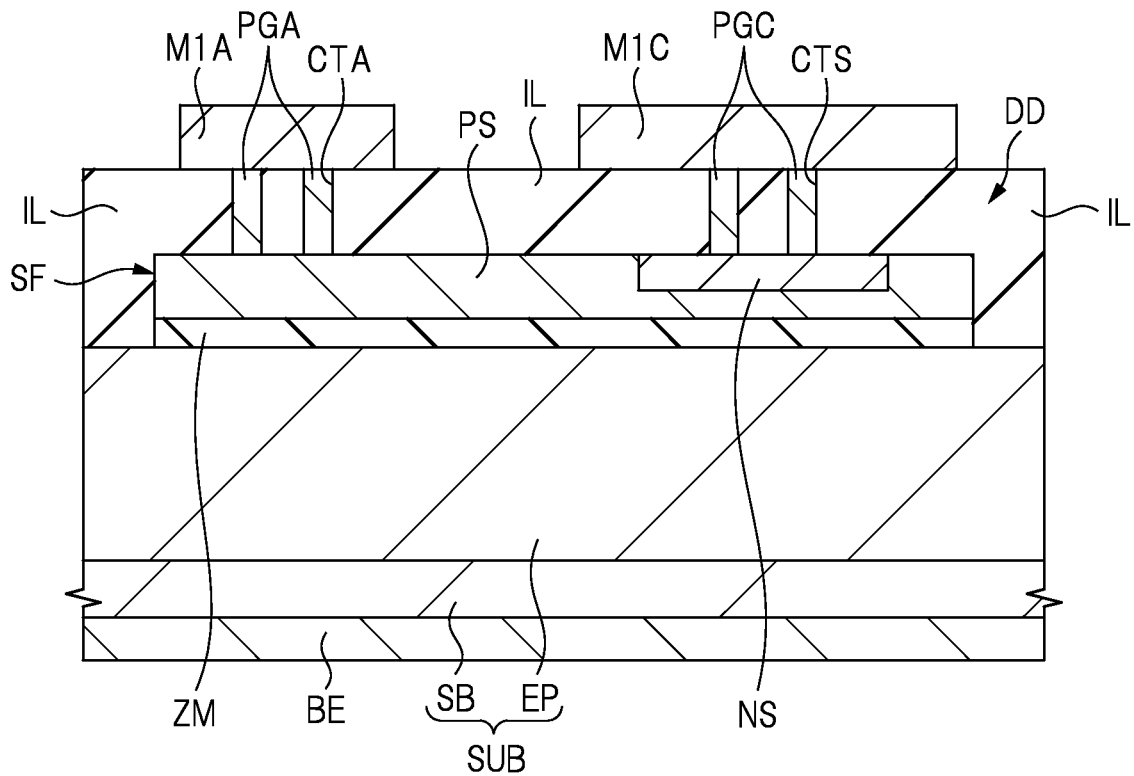
FIG. 52 is a cross-sectional view of a main part of the semiconductor device according to the yet another embodiment.
Figure 53:
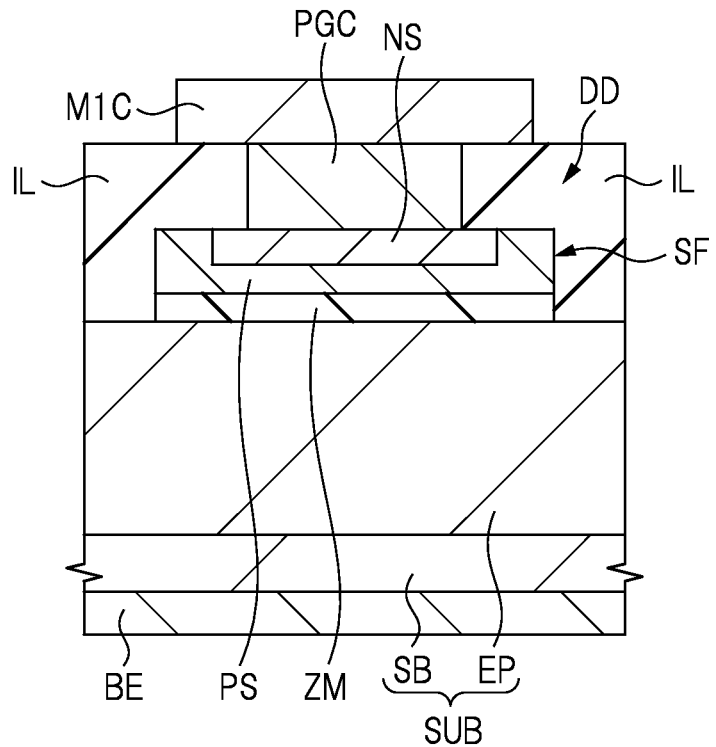
FIG. 53 is a cross-sectional view of a main part of the semiconductor device according to the yet another embodiment.

Each of FIGS. 50 and 51 is a plan view of a main part of a semiconductor device according to a third embodiment, and FIGS. 52 and 53 are cross-sectional views of the main part of the semiconductor device according to the third embodiment. FIGS. 50 to 53 correspond to FIGS. 2 to 5 of the first embodiment, respectively. A cross-sectional view at a position of line E1-E1 in each of FIGS. 50 and 51 substantially corresponds to that of FIG. 52, and a cross-sectional view at a position of line E2-E2 in each of FIGS. 50 and 51 corresponds substantially to that of FIG. 53.

Note that the structure of the semiconductor device of the third embodiment is almost the same as that of the semiconductor device CP of the above-mentioned first embodiment except for the structure of the diode DD. Therefore, in the third embodiment, a point different from the first embodiment about the structure of the diode DD will be mainly described below.

In the above-mentioned first embodiment, the silicon film SF constituting the diode DD has the p-type silicon region PS and the plurality of n-type silicon regions NS, each of the plurality of n-type silicon regions NS being having been surrounded by the p-type silicon region PS in a plan view.

In contrast, in the present third embodiment, the silicon film SF constituting the diode DD has the p-type silicon region PS and the n-type silicon region NS, the n-type silicon region NS being surrounded by the p-type silicon region PS, but the number of n-type silicon regions NS formed in the silicon film SF being one.

The preset third embodiment is almost the same as the above-mentioned first embodiment in that the depth position of the bottom surface of the n-type silicon region NS formed in the silicon film SF is shallower than that of the lower surface of the silicon film SF. Consequently, also in the present third embodiment, the thickness of the n-type silicon region NS is smaller than the thickness of the silicon film SF. Therefore, the n-type silicon region NS does not penetrate the silicon film SF in the thickness direction of the silicon film SF. For this reason, also in the present third embodiment, the n-type silicon region NS is not exposed on the lower surface of the silicon film SF, and the p-type silicon region PS exists under the bottom surface of the n-type silicon region NS. Consequently, also in the present third embodiment, the side surface and the bottom surface of the n-type silicon region NS contact with the p-type silicon region PS, and the PN junctions are formed on the side surface and the bottom surface of the n-type silicon region NS.

In the present third embodiment, the n-type silicon region NS formed on the silicon film SF is electrically connected to the wiring M1C via the plug PGC. Consequently, although the plug PGC is arranged on the n-type silicon region NS of the silicon film SF, the number of plugs PGC can be any of one or more. FIG. 51 shows a case where: two plugs PGC are arranged on the n-type silicon region NS of the silicon film SF; and the n-type silicon region NS and the wiring M1C are electrically connected via the two plugs PGC. In a case of FIG. 51, the plug PGC has a rectangularly planar shape whose longitudinal direction is the Y direction in a plan view, and the two plugs PGC are arranged so as to be separated from each other in the X direction.

Besides the above points, a configuration of the semiconductor device of the present second embodiment is almost the same as that of the semiconductor device CP of the above-mentioned first embodiment, so that a repetitive description thereof will be omitted here.

In the present third embodiment, the PN junctions are formed not only on the side surface of the n-type silicon region NS but also on the bottom surface of the n-type silicon region NS. Consequently, as compared with the above-mentioned examination examples (FIGS. 7 and 8) in which no PN junction is formed on the bottom surface of the n-type silicon region NS10, the present third embodiment (FIGS. 50 to 53) in which the PN junction is formed on the bottom surface of the n-type silicon region NS can make the total area of the PN junction surfaces constituting the diode DD larger. In other words, the total area of the PN junctions constituting the diode DD can be increased while the plane dimensions (plane area) of the silicon film SF is suppressed. Consequently, since the operating resistance of the diode DD can be reduced, the heat generation amount of the diode DD can be suppressed. Therefore, the reliability of the diode DD can be improved and, accordingly, the reliability of the semiconductor device CP including the diode DD can be improved. Further, the performance of the semiconductor device CP including the diode DD can be improved. In addition, the semiconductor device can be miniaturized (made small in area).

The above-mentioned first to third embodiments are devised so that the total area of the PN junctions constituting the diode DD is increased. There are two methods for increasing the total area of the PN junctions constituting the diode DD. A first method is to: surround the n-type silicon region NS by the p-type silicon region PS in a plan view so that the PN junction is formed on the side surface of the n-type silicon region NS; increase the total number of side surfaces of the n-type silicon region NS by increasing the number (two or more) of n-type silicon regions NS formed on the silicon film SF; and thereby increase the total area of the side surfaces of the n-type silicon region NS. A second method is to: causing the p-type silicon region PS to exist under the bottom surface of the n-type silicon region NS by making the depth position of the bottom surface of the n-type silicon region NS shallower than that of the lower surface of the silicon film SF; and form the PN junctions not only on the bottom surface of the n-type silicon region NS but also on the bottom surface of the n-type silicon region NS. The present third embodiment applies the second method, the above-mentioned second embodiment applies the first method, and the above-mentioned first embodiment applies both the first method and the second method.

For this reason, the above-mentioned first embodiment among the first to third embodiments can maximize the total area of the PN junctions constituting the diode DD and, accordingly, can minimize the operating resistance of the diode DD. Therefore, in improving the reliability of the semiconductor device CP including the diode DD, the above-described first embodiment is the most advantageous among the first to third embodiments.

As described above, the invention made by the present inventors has been specifically described based on the embodiments thereof, but the present invention is not limited to the above-mentioned embodiments and can be variously modified without departing from the scope thereof, needless to say.

What is claimed is:

1. A semiconductor device provided with a diode, comprising:
    a semiconductor substrate;
    a silicon film for the diode, the silicon film being formed over the semiconductor substrate via a first insulating film; and
    a first electrode for the diode and a second electrode, the first and second electrodes being formed on an upper layer of the silicon film,
    wherein the silicon film has a first silicon region of a first conductive type and a plurality of second silicon regions of a second conductive type, the second conductive type being opposite to the first conductive type,
    wherein each of the plurality of second silicon regions is surrounded by the first silicon region in a plan view,
    wherein the first silicon region is electrically connected to the first electrode, and
    wherein the plurality of second silicon regions are electrically connected to the second electrode,
    wherein, in a plan view, the plurality of second silicon regions each extend in a first direction, and are arranged apart from each other in a second direction that intersects with the first direction.

2. The semiconductor device according to claim 1, wherein each of the plurality of second silicon regions is exposed on an upper surface of the silicon film.

3. The semiconductor device according to claim 2, wherein the first silicon region exists below each of the plurality of second silicon regions.

4. The semiconductor device according to claim 3,
    wherein the first conductive type is a p type,
    wherein the second conductive type is an n type, and
    wherein PN junctions are formed on a side surface and a bottom surface of each of the plurality of second silicon regions.

5. The semiconductor device according to claim 2, wherein each of the plurality of second silicon regions is exposed on a lower surface of the silicon film.

6. The semiconductor device according to claim 5,
    wherein the first conductive type is a p type,
    wherein the second conductive type is an n type, and
    wherein a PN junction is formed on each side surface of the plurality of second silicon regions.

7. The semiconductor device according to claim 1, wherein, in a plan view, the plurality of second silicon regions each have a rectangularly planar shape whose longitudinal direction is the first direction.

8. The semiconductor device according to claim 7, wherein the planar shape of each of the plurality of second silicon regions has a length of 2 to 40 μm in the first direction.

9. The semiconductor device according to claim 1,
    wherein the first silicon region is electrically connected to the first electrode via a first contact plug, and
    wherein the plurality of second silicon regions are electrically connected to the second electrode via a plurality of second contact plugs.

10. The semiconductor device according to claim 9, further comprising an interlayer insulating film formed between the silicon film and the first and second electrodes, wherein the first contact plug and the plurality of second contact plugs each penetrate the interlayer insulating film.

11. The semiconductor device according to claim 10,
    wherein the first contact plug overlaps with the first electrode in a plan view and overlaps with the first silicon region in a plan view, and
    wherein the plurality of second contact plugs respectively overlap with the plurality of second silicon regions in a plan view, and respectively overlap with the second electrode in a plan view.

12. The semiconductor device according to claim 1,
    wherein the first conductive type is a p type,
    wherein the second conductive type is an n type, and
    wherein a PN junction is formed between the first silicon region and the plurality of second silicon regions.

13. The semiconductor device according to claim 1, further comprising a field effect transistor formed in a first region of the semiconductor substrate,
    wherein the silicon film is formed on a second region of the semiconductor substrate via the first insulating film.

14. The semiconductor device according to claim 1, wherein the diode is a diode for temperature detection.

15. A semiconductor device provided with a diode, comprising:
    a semiconductor substrate; and
    a silicon film for the diode, the silicon film being formed on the semiconductor substrate via a first insulating film; and
    a first electrode for the diode and a second electrode, the first and second electrodes being formed on the silicon film,
    wherein the silicon film has a first silicon region of a first conductive type and a second silicon region of a second conductive type, the second conductive type being opposite to the first conductive type,
    wherein the second silicon region is surrounded by the first silicon region in a plan view,
    wherein the second silicon region is exposed on an upper surface of the silicon film,
    wherein the first silicon region exists below the second silicon region,
    wherein the first silicon region is electrically connected to the first electrode via a first contact plug, and
    wherein the second silicon region is electrically connected to the second electrode via a plurality of second contact plugs.

16. The semiconductor device according to claim 15,
    wherein the first conductive type is a p type,
    wherein the second conductive type is an n type, and
    wherein PN junctions are formed on a side surface and a bottom surface of the second silicon region.

17. A method of manufacturing a semiconductor device provided with a diode, the method comprising:
    (a) forming a silicon film of a first conductive type and for the diode on a semiconductor substrate via a first insulating film;
    (b) forming a mask layer having an opening that partially exposes the silicon film; and
    (c) ion-implanting an impurity of a second conductive type into the silicon film exposed from the opening to form a silicon region of the second conductive type in the silicon film, the second conductive type being opposite to the first conductive type,
    wherein a thickness of the silicon region formed in the (c) is smaller than a thickness of the silicon film, and wherein PN junctions are formed on a side surface and a bottom surface of the silicon region.

18. The method of manufacturing a semiconductor device according to claim 17, wherein the mask layer is an interlayer insulating film, and the method further comprises:
   (d) forming a contact plug in the opening of the mask layer after the (c).

19. The method of manufacturing a semiconductor device according to claim 17, further comprising:
   (d) forming a trench gate electrode for a field effect transistor on the semiconductor substrate; and
   (e) forming a source region for the field effect transistor on the semiconductor substrate by ion implantation,
   wherein the ion implantation in the (c) and the ion implantation in the (e) are performed by the same ion implantation step.

* * * * *